United States Patent
Black et al.

(10) Patent No.: US 8,970,516 B2
(45) Date of Patent: Mar. 3, 2015

(54) INTEGRATED PASSIVES AND POWER AMPLIFIER

(75) Inventors: Justin Phelps Black, Santa Clara, CA (US); Ravindra V. Shenoy, Dublin, CA (US); Evgeni Petrovich Gousev, Saratoga, CA (US); Aristotele Hadjichristos, San Diego, CA (US); Thomas Andrew Myers, San Diego, CA (US); Jonghae Kim, San Diego, CA (US); Mario Francisco Velez, San Diego, CA (US); Je-Hsiung Jeffrey Lan, San Diego, CA (US); Chi Shun Lo, San Diego, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 311 days.

(21) Appl. No.: 13/235,158

(22) Filed: Sep. 16, 2011

(65) Prior Publication Data

US 2012/0075216 A1 Mar. 29, 2012

Related U.S. Application Data

(60) Provisional application No. 61/385,913, filed on Sep. 23, 2010.

(51) Int. Cl.
*G06F 3/041* (2006.01)
*G02B 26/00* (2006.01)
(Continued)

(52) U.S. Cl.
CPC ............. *G02B 26/001* (2013.01); *H01L 21/565* (2013.01); *H01L 23/3128* (2013.01); *H01L 2224/16225* (2013.01); *H01L 2924/09701* (2013.01)
USPC ............ 345/173; 257/E27.011; 257/E21.003; 257/257; 257/531; 330/289; 438/381

(58) Field of Classification Search
None
See application file for complete search history.

(56) References Cited

U.S. PATENT DOCUMENTS 6,221,690 B1 * 4/2001 Taniguchi et al. ............ 438/106
6,462,950 B1 10/2002 Pohjonen
(Continued)

FOREIGN PATENT DOCUMENTS

JP 2001503202 A 3/2001
JP 2006179564 A 7/2006
(Continued)

OTHER PUBLICATIONS

International Search Report and Written Opinion—PCT/US2011/052017—ISA/EPO—Dec. 29, 2011.
(Continued)

*Primary Examiner* — Jason Olson
(74) *Attorney, Agent, or Firm* — Weaver Austin Villeneuve & Sampson

(57) ABSTRACT

This disclosure provides systems, methods and apparatus for combining devices deposited on a first substrate, with integrated circuits formed on a second substrate such as a semiconducting substrate or a glass substrate. The first substrate may be a glass substrate. The first substrate may include conductive vias. A power combiner circuit may be deposited on a first side of the first substrate. The power combiner circuit may include passive devices deposited on at least the first side of the first substrate. The integrated circuit may include a power amplifier circuit disposed on and configured for electrical connection with the power combiner circuit, to form a power amplification system. The conductive vias may include thermal vias configured for conducting heat from the power amplification system and/or interconnect vias configured for electrical connection between the power amplification system and a conductor on a second side of the first substrate.

47 Claims, 25 Drawing Sheets

(51) Int. Cl.
  *H01L 21/56*    (2006.01)
  *H01L 23/31*    (2006.01)

(56) References Cited

U.S. PATENT DOCUMENTS

| | | | |
|---|---|---|---|
| 6,961,245 | B2 | 11/2005 | Ikuta et al. |
| 7,061,102 | B2 * | 6/2006 | Eghan et al. ............ 257/713 |
| 7,183,650 | B2 | 2/2007 | Shiono et al. |
| 7,668,415 | B2 | 2/2010 | Tyger |
| 2002/0064029 | A1 | 5/2002 | Pohjonen |
| 2007/0053167 | A1 | 3/2007 | Ueda |
| 2008/0150065 | A1 | 6/2008 | Oda |
| 2009/0309662 | A1 | 12/2009 | Yang et al. |
| 2010/0044853 | A1 | 2/2010 | Dekker et al. |
| 2010/0144230 | A1 | 6/2010 | Tyger |

FOREIGN PATENT DOCUMENTS

| | | |
|---|---|---|
| JP | 2008098285 A | 4/2008 |
| JP | 2008159869 A | 7/2008 |
| WO | 9819339 A1 | 5/1998 |
| WO | 2006129354 A1 | 12/2006 |
| WO | WO2006134214 A1 | 12/2006 |
| WO | WO2009076075 | 6/2009 |

OTHER PUBLICATIONS

U.S. Appl. No. 61/385,913, entitled "Integrated MEMS-Based Passives and Power Amplifier," filed Sep. 23, 2010.
Written Opinion of the International Preliminary Examining Authority—PCT/US2011/052017—ISA/EPO—Sep. 26, 2012.
Japanese Office Action dated Aug. 5, 2014, in application No. 2013-530204.

* cited by examiner

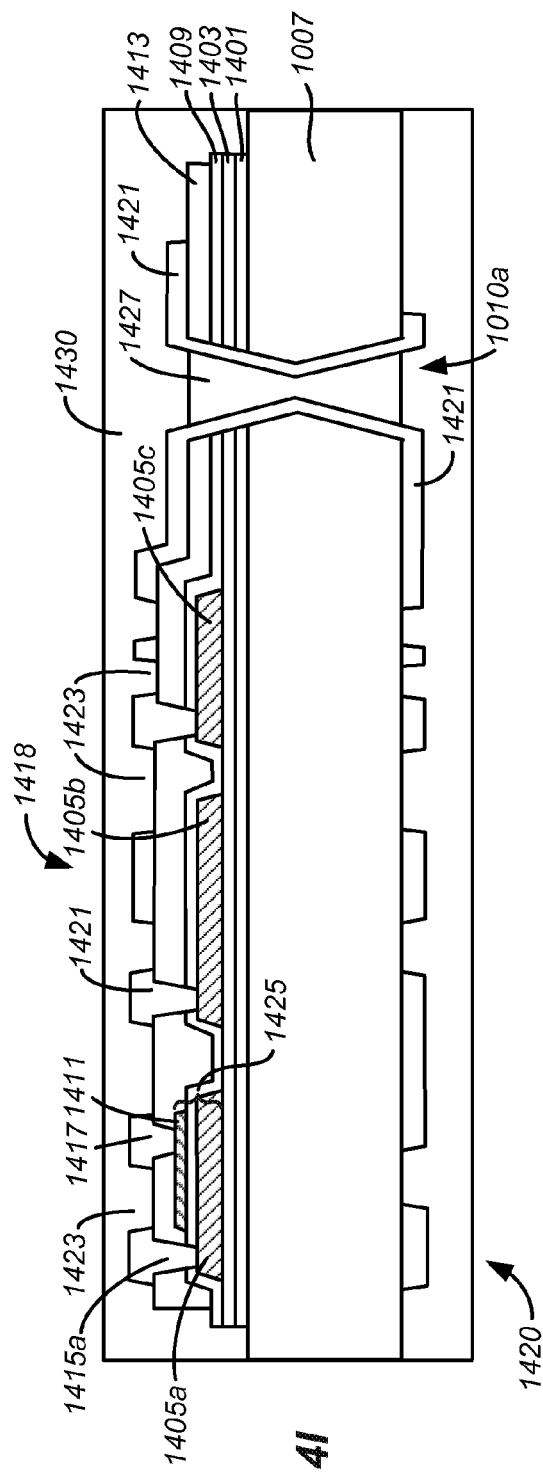
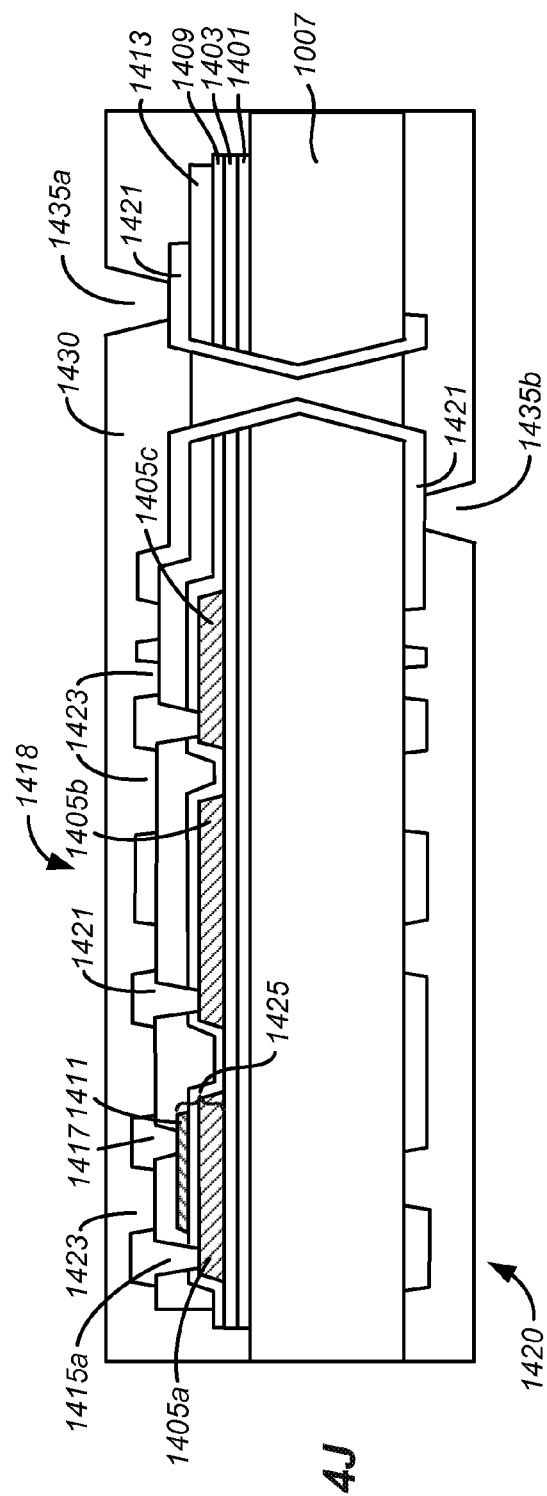
Figure 14I
Figure 14J

INTEGRATED PASSIVES AND POWER AMPLIFIER

PRIORITY CLAIM

This application claims priority to U.S. Provisional Patent Application No. 61/385,913, entitled "INTEGRATED MEMS-BASED PASSIVES AND POWER AMPLIFIER" and filed on Sep. 23, 2010, which is hereby incorporated by reference and for all purposes.

TECHNICAL FIELD

This disclosure relates to electromechanical and microelectronic systems.

DESCRIPTION OF THE RELATED TECHNOLOGY

Electromechanical systems (EMS) include devices having electrical and mechanical elements, actuators, transducers, sensors, optical components (including mirrors) and electronics. Electromechanical systems can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). As used herein, the term interferometric modulator or interferometric light modulator refers to a device that selectively absorbs and/or reflects light using the principles of optical interference. In some implementations, an interferometric modulator may include a pair of conductive plates, one or both of which may be transparent and/or reflective, wholly or in part, and capable of relative motion upon application of an appropriate electrical signal. In an implementation, one plate may include a stationary layer deposited on a substrate and the other plate may include a reflective membrane separated from the stationary layer by an air gap. The position of one plate in relation to another can change the optical interference of light incident on the interferometric modulator. Interferometric modulator devices have a wide range of applications, and are anticipated to be used in improving existing products and creating new products, especially those with display capabilities.

Recently, there has been increased interest in fabricating small-scale power amplifiers. For example, some power amplifiers have been fabricated on silicon-on-insulator (SOI) type complementary metal-oxide-semiconductors (CMOS). Although such power amplifiers are generally satisfactory, it would be desirable to provide improved small-scale power amplifiers with smaller size, fewer externally packaged components and higher performance.

SUMMARY

The systems, methods and devices of the disclosure each have several innovative aspects, no single one of which is solely responsible for the desirable attributes disclosed herein.

Some implementations described herein provide a device that includes a substrate having at least one passive component formed thereon. The substrate may be a glass substrate. An integrated circuit die may be attached to a first surface of the substrate. A plurality of vias may extend through the substrate, between the first surface and a second surface of the substrate. The vias may be electrically and/or thermally conductive. The integrated circuit die may be electrically connected to at least one passive component and to at least one via. The integrated circuit die may be a power amplifier chip that includes a power amplifier circuit. In some implementations, at least some of the passive devices may form a power combiner circuit. The power amplifier chip and the power combiner circuit may form a power amplification system.

Some implementations described herein involve an integrated device that includes a glass substrate having a first surface and a second surface that is substantially parallel to the first surface. The integrated device may have at least one passive component formed from at least one patterned layer disposed on the first surface and an integrated circuit die attached to the first surface of the glass substrate. The integrated device may have a plurality of through-glass vias extending between the first surface and the second surface of the glass substrate The integrated circuit die may be electrically connected to the at least one passive component and at least one through-glass via.

At least one passive component may be a resistor, a capacitor, a variable capacitor, a varactor, an inductor, a filter, a transformer, a coupler, a directional coupler, a power splitter, a transmission line, a waveguide and/or an antenna. In some implementations, a plurality of the passive components may form a power combiner. The integrated circuit die may include a power amplifier circuit. The at least one passive component and the integrated circuit die may form a power amplification system. The integrated device may include a thermal via extending between the first surface and the second surface of the glass substrate. The thermal via may be in thermal contact with the integrated circuit die.

An alternative apparatus may include a first substrate having conductive vias and a power combiner circuit deposited. In some implementations, the first substrate may be a glass substrate. The power combiner circuit may include a plurality of passive devices deposited on at least a first side of the first substrate. The plurality of passive devices may include at least one of a resistor, a capacitor, a variable capacitor, a varactor, an inductor, a filter, a transformer, a coupler, a directional coupler, a power splitter, a transmission line, a waveguide and/or an antenna. The apparatus also may include at least one active component deposited on the first side of the first substrate.

The apparatus may include a power amplifier chip having a power amplifier circuit formed on a second substrate. The second substrate may be a glass substrate, a silicon substrate, a layered silicon-insulator-silicon substrate, a gallium arsenide substrate or a silicon-on-sapphire substrate. The power amplifier chip may be disposed on and configured for electrical connection with the power combiner circuit. The power amplifier circuit and the power combiner circuit may form a power amplification system.

The conductive vias may include one or more interconnect vias configured for electrical connection between the power amplification system and a conductor on a second side of the first substrate. The apparatus may include metalized pads on the second side of the first substrate. The interconnect vias may be configured for electrical connection between the power amplification system and the metalized pads.

The conductive vias may include at least one thermal via configured for conducting heat from the power amplification system. At least one thermal via may be wider than at least one interconnect via. In some implementations, a thermal via may have a width that is at least twice that of an interconnect via. In some such implementations, the thermal via has a width that is between two and five times that of the interconnect via. At least one of the thermal vias may be configured for conducting electricity between the power amplification system and the second side of the first substrate. However, in some implementations at least one thermal via may not be configured for conducting electricity between the power amplification system and the second side of the first substrate.

The power amplifier chip may be configured for electrical connection with the power combiner circuit via solder bumps. The power amplifier chip may cover at least a portion of the passive devices. The apparatus may include at least one passive device or active device deposited on a second side of the first substrate and configured for electrical connection with the power amplification system.

The apparatus also may include a display and a processor that is configured to communicate with the display. The processor may be configured to process image data. The apparatus also may include a memory device that is configured to communicate with the processor. The apparatus also may include a driver circuit configured to send at least one signal to the display and a controller configured to send at least a portion of the image data to the driver circuit. The apparatus may include an input device configured to receive input data and to communicate the input data to the processor. The apparatus also may include a receiver, a transceiver and/or a transmitter.

The apparatus may include an enclosure formed around the power amplification system. In some implementations, the enclosure may include a molding, such as an epoxy molding. In some implementations, the enclosure may include a metal cage. The enclosure may include a dielectric lid, such as a glass lid, having an inner conductive coating. The conductive coating may be a metal coating. The inner conductive coating may be electrically grounded.

A packaged electronic device may include the apparatus. The packaged electronic device may include at least one additional integrated circuit.

Some methods described herein involve forming a plurality of vias in a glass substrate, at least partially filling the vias with conductive material, depositing passive devices on at least a first side of the glass substrate to form a power combiner circuit and configuring a power amplifier chip for electrical connection with the power combiner circuit to form a power amplification system. The power amplifier chip may include a power amplifier circuit formed on another substrate, such as a semiconducting substrate.

Forming the plurality of vias may involve forming the vias by laser drilling, sand blasting or etching. The forming process may involve forming at least one thermal via configured for conducting heat from the power amplification system and forming interconnect vias configured for electrical connection between the power amplification system and a conductor on a second side of the glass substrate. Filling the vias may involve filling at least the interconnect vias with electrically conductive material. Filling the vias may involve filling at least the thermal vias with thermally conductive material.

At least one of the thermal vias may be formed with a larger width than at least one of the interconnect vias. In some implementations, at least one of the thermal vias may be formed with a width that is at least twice that of at least one of the interconnect vias. In some such implementations, at least one of the thermal vias may be formed with a width that is between two and five times that of at least one of the interconnect vias.

The configuring process may involve attaching the power amplifier chip to the power combiner circuit via a flip-chip solder joining process, a copper pillar flip-chip joining process, or an anisotropic conductive film process. The configuring process may involve attaching the power amplifier chip to the power combiner circuit and underfilling the power amplifier chip with an electrically insulating adhesive. The configuring process may involve attaching the power amplifier chip to the power combiner circuit by underfilling the power amplifier chip with a thermally conductive material for dissipating heat from the power amplifier system. In some implementations, the power amplifier chip may cover at least a portion of the passive devices. The method may involve depositing a passive device on a second side of the glass substrate.

Details of one or more implementations of the subject matter described in this specification are set forth in the accompanying drawings and the description below. Although the examples provided in this disclosure are primarily described in terms of electromechanical systems (EMS) and microelectromechanical systems (MEMS)-based displays, the concepts provided herein may apply to other types of displays, such as liquid crystal displays, organic light-emitting diode ("OLED") displays and field emission displays. Other features, aspects, and advantages will become apparent from the description, the drawings, and the claims. Note that the relative dimensions of the following figures may not be drawn to scale.

BRIEF DESCRIPTION OF THE DRAWINGS

FIGS. 14A-14L show examples of partial device cross-sections during stages in a process of passive device fabrication according to FIG. 13.

Like reference numbers and designations in the various drawings indicate like elements.

DETAILED DESCRIPTION

Figure 1:
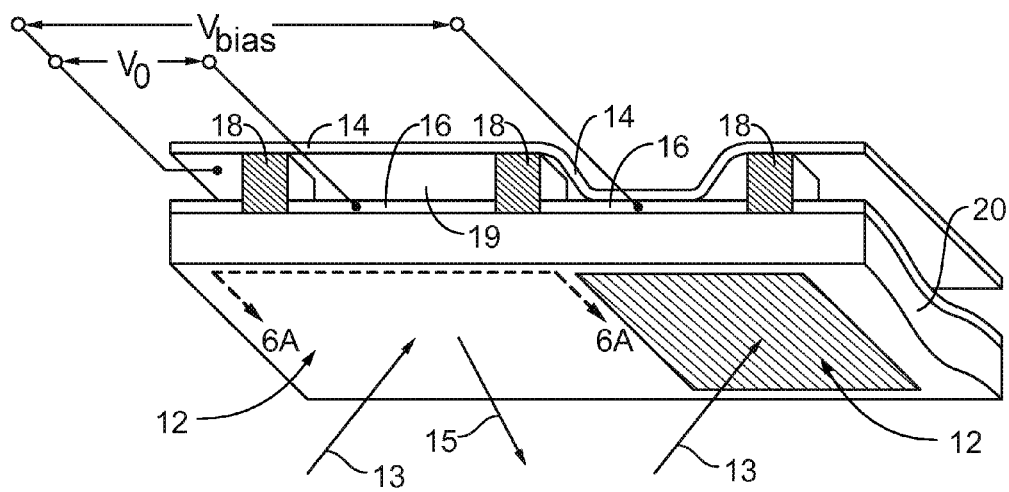
FIG. 1 shows an example of an isometric view depicting two adjacent pixels in a series of pixels of an interferometric modulator (IMOD) display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device or system that can be configured to display an image, whether in motion (e.g., video) or stationary (e.g., still image), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, GPS receivers/navigators, cameras, MP3 players, camcorders, game consoles, wrist watches, clocks, calculators, television monitors, flat panel displays, electronic reading devices (i.e., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS), microelectromechanical systems (MEMS) and non-MEMS applications), aesthetic structures (e.g., display of images on a piece of jewelry) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

This disclosure provides systems, methods and apparatus for combining devices deposited on a first substrate, which may be a glass substrate, with at least one integrated circuit formed on a second substrate, such as a silicon-based substrate. At least some of the devices deposited on the first substrate may be passive devices. Although much of this disclosure involves forming a power amplification system in such a manner, this disclosure is not limited to such implementations. Instead, many aspects described herein apply generally to combining an integrated circuit die with passive devices formed on glass. For example, processes that are similar to those described herein may be used to form a receive/transmit radio (RTR), a low noise amplifier, a mixer, an active filter, a digital signal processor, a controller, a line driver, an optical transceiver, a wireless sensor, a power supply bias generation or regulation circuit, a phased-array circuit, an analog-to-digital or digital-to-analog converter, a memory, combinations thereof and/or other devices.

In one aspect, the passive device(s) may include one or more resistors, capacitors, variable capacitors, varactors, inductors, filters, transformers, couplers, directional couplers, power splitters, transmission lines, waveguides, or antennas. The apparatus also may include at least one active component deposited on the first side of the first substrate. The apparatus also may include at least one passive device or active device deposited on a second side of the first substrate.

An integrated circuit die may be attached to a first surface of the first substrate. A plurality of vias may extend through the first substrate, between the first surface and a second surface of the first substrate. The vias may be electrically and/or thermally conductive. The integrated circuit die may be electrically connected to at least one passive component and to at least one via.

In some implementations, the first substrate may be formed of a material having properties similar to those of glass, such as plastic. The integrated circuit die may be formed on a layered silicon-insulator-silicon substrate, which is also known as a "silicon on insulator" (SOI) substrate. In some other implementations, the integrated circuit die may be formed on a glass substrate, a silicon substrate, a gallium arsenide substrate, or a silicon-on-sapphire substrate.

A power combiner circuit may include at least some of the passive devices deposited on at least the first side of the first substrate. The integrated circuit die may include a power amplifier circuit disposed on, and configured for electrical connection with, the power combiner circuit, to form a power amplification system. The thermally conductive vias may be configured for conducting heat from the power amplification system to a heat sink on a second side of the substrate. The thermally conductive vias may or may not be electrically conductive, according to the particular implementation. Some of the thermally conductive vias may be wider than electrically conductive interconnect vias, e.g., two to five times wider.

Particular implementations of the subject matter described in this disclosure can be implemented to realize one or more of the following potential advantages. For example, passive components for power combiners have previously been co-fabricated on SOI wafers with active power amplification circuitry. In some instances, the footprint of such an integrated circuit may be restricted due to the cost of the fabrication process or the desire for a small form factor. According to some implementations provided herein, the passive devices may be spread over a larger area than the footprint of the integrated circuit. This may be advantageous because fabricating the passives devices on glass may be relatively less expensive.

Furthermore, according to some implementations provided herein, stacking of the SOI substrate and the glass substrate results in a reduction in the total area occupied by the power amplification system than if the passives were integrated with the SOI substrate. Such solutions also may eliminate separate packaging and assembly requirements and reduce the total number of separate components. In some through-glass via implementations, passive devices may be fabricated on the top and bottom sides of the glass substrate. In other through-glass via implementations, some passive devices may span both the top and bottom sides of the glass substrate. Such implementations may offer yet further improvements in performance and or further reductions in total occupied area.

In some stacked implementations, forming passives on a glass substrate can have the following advantages compared to forming passives on the power amplification chip or on a printed circuit board: higher Q, greater accuracy, stability, and tolerance, lower parasitics, higher reliability, and lower cost. In some stacked implementations, the solder balls, passive components, active elements, and through-glass vias can be configured to reduce loss and minimize undesired coupling between electrical terminals of the power amplification system, thus providing higher electrical isolation. In some stacked implementations, the solder balls, passive components, active elements, and through-glass vias are configured to precisely control impedance levels and trace lengths of electrical interconnects of the power amplification system. Minimizing electrical line lengths can reduce the coupling of noise and reduce return and insertion losses. Reducing losses can further reduce heat generated in the system, in turn improving reliability and the overall performance of the power amplification system. In some implementations, isolating the passive devices from heat generated from the power amplifier chip can improve reliability or component stability.

Moreover, in some implementations, stacking also can reduce the overall area or footprint of the power amplification system. In some implementations, stacking elevates the power combiner passives and active circuitry above a printed circuit board (PCB) which can reduce coupled noise or losses from parasitics of the PCB or other peripheral circuit elements.

Because the power amplifier circuit consumes a significant fraction of the power in typical electronic devices, it is important to minimize any losses in the transmit chain that would otherwise lower the efficiency. Transferring the passives from the SOI or CMOS substrate affords additional degrees of freedom in the design of the position of the passives with respect to other elements of the power amplification system such as the active circuitry or solder balls. This flexibility can help to reduce insertion and return losses, improve electrical isolation and matching in part by minimizing trace lengths and impedance discontinuities, and improve reliability.

An example of a suitable EMS or MEMS device, to which the described implementations may apply, is a reflective display device. Reflective display devices can incorporate interferometric modulators (IMODs) to selectively absorb and/or reflect light incident thereon using principles of optical interference. IMODs can include an absorber, a reflector that is movable with respect to the absorber, and an optical resonant cavity defined between the absorber and the reflector. The reflector can be moved to two or more different positions, which can change the size of the optical resonant cavity and thereby affect the reflectance of the interferometric modulator. The reflectance spectrums of IMODs can create fairly broad spectral bands which can be shifted across the visible wavelengths to generate different colors. The position of the spectral band can be adjusted by changing the thickness of the optical resonant cavity. One way of changing the optical resonant cavity is by changing the position of the reflector.

FIG. 1 shows an example of an isometric view depicting two adjacent pixels in a series of pixels of an interferometric modulator (IMOD) display device. The IMOD display device includes one or more interferometric MEMS display elements. In these devices, the pixels of the MEMS display elements can be in either a bright or dark state. In the bright ("relaxed," "open" or "on") state, the display element reflects a large portion of incident visible light, e.g., to a user. Conversely, in the dark ("actuated," "closed" or "off") state, the display element reflects little incident visible light. In some implementations, the light reflectance properties of the on and off states may be reversed. MEMS pixels can be configured to reflect predominantly at particular wavelengths allowing for a color display in addition to black and white.

The IMOD display device can include a row/column array of IMODs. Each IMOD can include a pair of reflective layers, i.e., a movable reflective layer and a fixed partially reflective layer, positioned at a variable and controllable distance from each other to form an air gap (also referred to as an optical gap or cavity). The movable reflective layer may be moved between at least two positions. In a first position, i.e., a relaxed position, the movable reflective layer can be positioned at a relatively large distance from the fixed partially reflective layer. In a second position, i.e., an actuated position, the movable reflective layer can be positioned more closely to the partially reflective layer. Incident light that reflects from the two layers can interfere constructively or destructively depending on the position of the movable reflective layer, producing either an overall reflective or non-reflective state for each pixel. In some implementations, the IMOD may be in a reflective state when unactuated, reflecting light within the visible spectrum, and may be in a dark state when unactuated, absorbing and/or destructively interfering light within the visible range. In some other implementations, however, an IMOD may be in a dark state when unactuated, and in a reflective state when actuated. In some implementations, the introduction of an applied voltage can drive the pixels to change states. In some other implementations, an applied charge can drive the pixels to change states.

The depicted portion of the pixel array in FIG. 1 includes two adjacent interferometric modulators 12 (i.e., IMOD pixels). In the IMOD 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the IMOD 12 on the left is insufficient to cause actuation of the movable reflective layer 14. In the IMOD 12 on the right, the movable reflective layer 14 is illustrated in an actuated position near, adjacent or touching the optical stack 16. The voltage $V_{bias}$ applied across the IMOD 12 on the right is sufficient to move and can maintain the movable reflective layer 14 in the actuated position.

In FIG. 1, the reflective properties of pixels 12 are generally illustrated with arrows 13 indicating light incident upon the pixels 12, and light 15 reflecting from the pixel 12 on the left. A person having ordinary skill in the art will readily recognize that most of the light 13 incident upon the pixels 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected at the movable reflective layer 14, back toward (and through) the transparent substrate 20. Interference (constructive or destructive) between the light reflected from the partially reflective layer of the optical stack 16 and the light reflected from the movable reflective layer 14 will determine the wavelength(s) of light 15 reflected from the pixel 12.

The optical stack 16 can include a single layer or several layers. The layer(s) can include one or more of an electrode layer, a partially reflective and partially transmissive layer and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals, such as chromium (Cr), semiconductors, and dielectrics. The partially reflective layer can be formed of one or more layers of materials, and each of the layers can be formed of a single material or a combination of materials. In some implementations, the optical stack 16 can include a single semi-transparent thickness of metal or semiconductor which serves as both an optical absorber and electrical conductor, while different, more electrically conductive layers or portions (e.g., of the optical stack 16 or of other structures of the IMOD) can serve to bus signals between IMOD pixels. The optical stack 16 also can include one or more insulating or dielectric layers covering one or more conductive layers or an electrically conductive/optically absorptive layer.

In some implementations, the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of posts 18 and an intervening sacrificial material deposited between the posts 18. When the sacrificial material is etched away, a defined gap 19, or optical cavity, can be formed between the movable reflective layer 14 and the optical stack 16. In some implementations, the spacing between posts 18 may be approximately 1-1000 um, while the gap 19 may be approximately less than 10,000 Angstroms (Å).

In some implementations, each pixel of the IMOD, whether in the actuated or relaxed state, is essentially a capacitor formed by the fixed and moving reflective layers. When no voltage is applied, the movable reflective layer 14 remains in a mechanically relaxed state, as illustrated by the pixel 12 on the left in FIG. 1, with the gap 19 between the movable reflective layer 14 and optical stack 16. However, when a potential difference, e.g., voltage, is applied to at least one of a selected row and column, the capacitor formed at the intersection of the row and column electrodes at the corresponding pixel becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated pixel 12 on the right in FIG. 1. The behavior is the same regardless of the polarity of the applied potential difference. Though a series of pixels in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
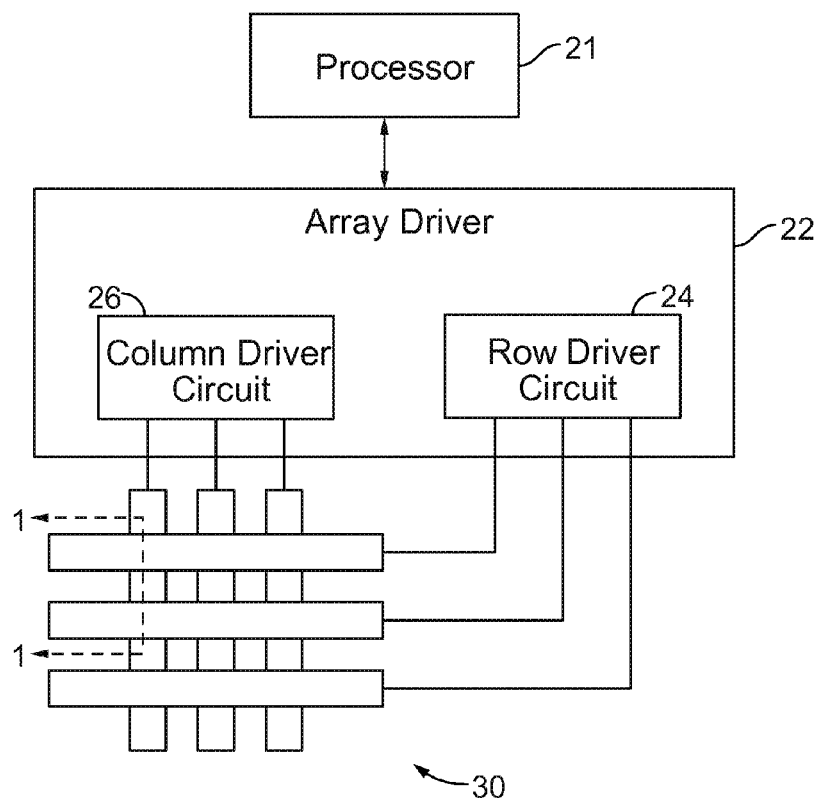
FIG. 2 shows an example of a system block diagram illustrating an electronic device incorporating a 3×3 interferometric modulator display.

FIG. 2 shows an example of a system block diagram illustrating an electronic device incorporating a 3×3 interferometric modulator display. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, e.g., a display array or panel 30. The cross section of the IMOD display device illustrated in FIG. 1 is shown by the lines 1-1 in FIG. 2. Although FIG. 2 illustrates a 3×3 array of IMODs for the sake of clarity, the display array 30 may contain a very large number of IMODs, and may have a different number of IMODs in rows than in columns, and vice versa.

Figures 3, 4:
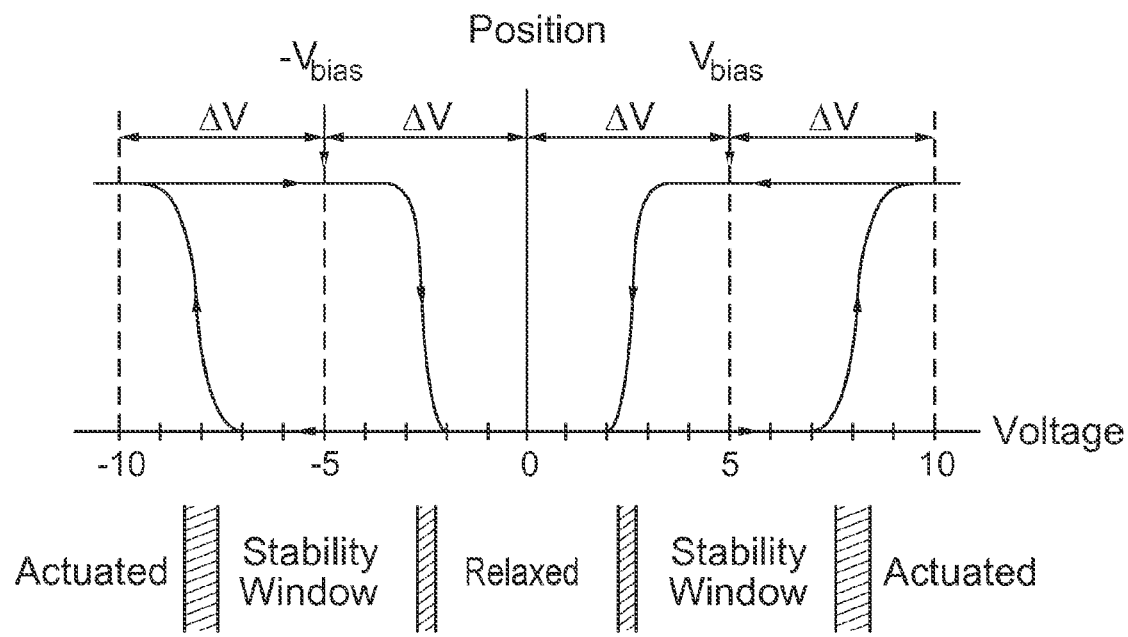
FIG. 3 shows an example of a diagram illustrating movable reflective layer position versus applied voltage for the interferometric modulator of FIG. 1.
FIG. 4 shows an example of a table illustrating various states of an interferometric modulator when various common and segment voltages are applied.

FIG. 3 shows an example of a diagram illustrating movable reflective layer position versus applied voltage for the interferometric modulator of FIG. 1. For MEMS interferometric modulators, the row/column (i.e., common/segment) write procedure may take advantage of a hysteresis property of these devices as illustrated in FIG. 3. An interferometric modulator may require, for example, about a 10-volt potential difference to cause the movable reflective layer, or mirror, to change from the relaxed state to the actuated state. When the voltage is reduced from that value, the movable reflective layer maintains its state as the voltage drops back below, e.g., 10-volts, however, the movable reflective layer does not relax completely until the voltage drops below 2-volts. Thus, a range of voltage, approximately 3 to 7-volts, as shown in FIG. 3, exists where there is a window of applied voltage within which the device is stable in either the relaxed or actuated state. This is referred to herein as the "hysteresis window" or "stability window." For a display array 30 having the hysteresis characteristics of FIG. 3, the row/column write procedure can be designed to address one or more rows at a time, such that during the addressing of a given row, pixels in the addressed row that are to be actuated are exposed to a voltage difference of about 10-volts, and pixels that are to be relaxed are exposed to a voltage difference of near zero volts. After addressing, the pixels are exposed to a steady state or bias voltage difference of approximately 5-volts such that they remain in the previous strobing state. In this example, after being addressed, each pixel sees a potential difference within the "stability window" of about 3-7-volts. This hysteresis property feature enables the pixel design, e.g., illustrated in FIG. 1, to remain stable in either an actuated or relaxed pre-existing state under the same applied voltage conditions. Since each IMOD pixel, whether in the actuated or relaxed state, is essentially a capacitor formed by the fixed and moving reflective layers, this stable state can be held at a steady voltage within the hysteresis window without substantially consuming or losing power. Moreover, essentially little or no current flows into the IMOD pixel if the applied voltage potential remains substantially fixed.

In some implementations, a frame of an image may be created by applying data signals in the form of "segment" voltages along the set of column electrodes, in accordance with the desired change (if any) to the state of the pixels in a given row. Each row of the array can be addressed in turn, such that the frame is written one row at a time. To write the desired data to the pixels in a first row, segment voltages corresponding to the desired state of the pixels in the first row can be applied on the column electrodes, and a first row pulse in the form of a specific "common" voltage or signal can be applied to the first row electrode. The set of segment voltages can then be changed to correspond to the desired change (if any) to the state of the pixels in the second row, and a second common voltage can be applied to the second row electrode. In some implementations, the pixels in the first row are unaffected by the change in the segment voltages applied along the column electrodes, and remain in the state they were set to during the first common voltage row pulse. This process may be repeated for the entire series of rows, or alternatively, columns, in a sequential fashion to produce the image frame. The frames can be refreshed and/or updated with new image data by continually repeating this process at some desired number of frames per second.

The combination of segment and common signals applied across each pixel (that is, the potential difference across each pixel) determines the resulting state of each pixel. FIG. 4 shows an example of a table illustrating various states of an interferometric modulator when various common and segment voltages are applied. As will be readily understood by one having ordinary skill in the art, the "segment" voltages can be applied to either the column electrodes or the row electrodes, and the "common" voltages can be applied to the other of the column electrodes or the row electrodes.

As illustrated in FIG. 4 (as well as in the timing diagram shown in FIG. 5B), when a release voltage $VC_{REL}$ is applied along a common line, all interferometric modulator elements along the common line will be placed in a relaxed state, alternatively referred to as a released or unactuated state, regardless of the voltage applied along the segment lines, i.e., high segment voltage $VS_H$ and low segment voltage $VS_L$. In particular, when the release voltage $VC_{REL}$ is applied along a common line, the potential voltage across the modulator (alternatively referred to as a pixel voltage) is within the relaxation window (see FIG. 3, also referred to as a release window) both when the high segment voltage $VS_H$ and the low segment voltage $VS_L$ are applied along the corresponding segment line for that pixel.

When a hold voltage is applied on a common line, such as a high hold voltage $VC_{HOLD\_H}$ or a low hold voltage $VC_{HOLD\_L}$, the state of the interferometric modulator will remain constant. For example, a relaxed IMOD will remain in a relaxed position, and an actuated IMOD will remain in an actuated position. The hold voltages can be selected such that the pixel voltage will remain within a stability window when the high segment voltage $VS_H$ and the low segment voltage $VS_L$ are applied along the corresponding segment line. Thus, the segment voltage swing, i.e., the difference between the high $VS_H$ and low segment voltage $VS_L$, is less than the width of either the positive or the negative stability window.

When an addressing, or actuation, voltage is applied on a common line, such as a high addressing voltage $VC_{ADD\_H}$ or a low addressing voltage $VC_{ADD\_L}$, data can be selectively written to the modulators along that line by application of segment voltages along the respective segment lines. The segment voltages may be selected such that actuation is dependent upon the segment voltage applied. When an addressing voltage is applied along a common line, application of one segment voltage will result in a pixel voltage within a stability window, causing the pixel to remain unactuated. In contrast, application of the other segment voltage will result in a pixel voltage beyond the stability window, resulting in actuation of the pixel. The particular segment voltage which causes actuation can vary depending upon which addressing voltage is used. In some implementations, when the high addressing voltage $VC_{ADD\_H}$ is applied along the common line, application of the high segment voltage $VS_H$ can cause a modulator to remain in its current position, while application of the low segment voltage $VS_L$ can cause actuation of the modulator. As a corollary, the effect of the segment voltages can be the opposite when a low addressing voltage $VC_{ADD\_L}$ is applied, with high segment voltage $VS_H$ causing actuation of the modulator, and low segment voltage $VS_L$ having no effect (i.e., remaining stable) on the state of the modulator.

In some implementations, hold voltages, address voltages, and segment voltages may be used which always produce the same polarity potential difference across the modulators. In some other implementations, signals can be used which alternate the polarity of the potential difference of the modulators. Alternation of the polarity across the modulators (that is, alternation of the polarity of write procedures) may reduce or inhibit charge accumulation which could occur after repeated write operations of a single polarity.

Figure 5A:
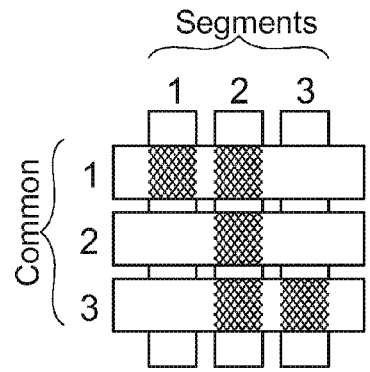
FIG. 5A shows an example of a diagram illustrating a frame of display data in the 3×3 interferometric modulator display of FIG. 2.
Figure 5B:
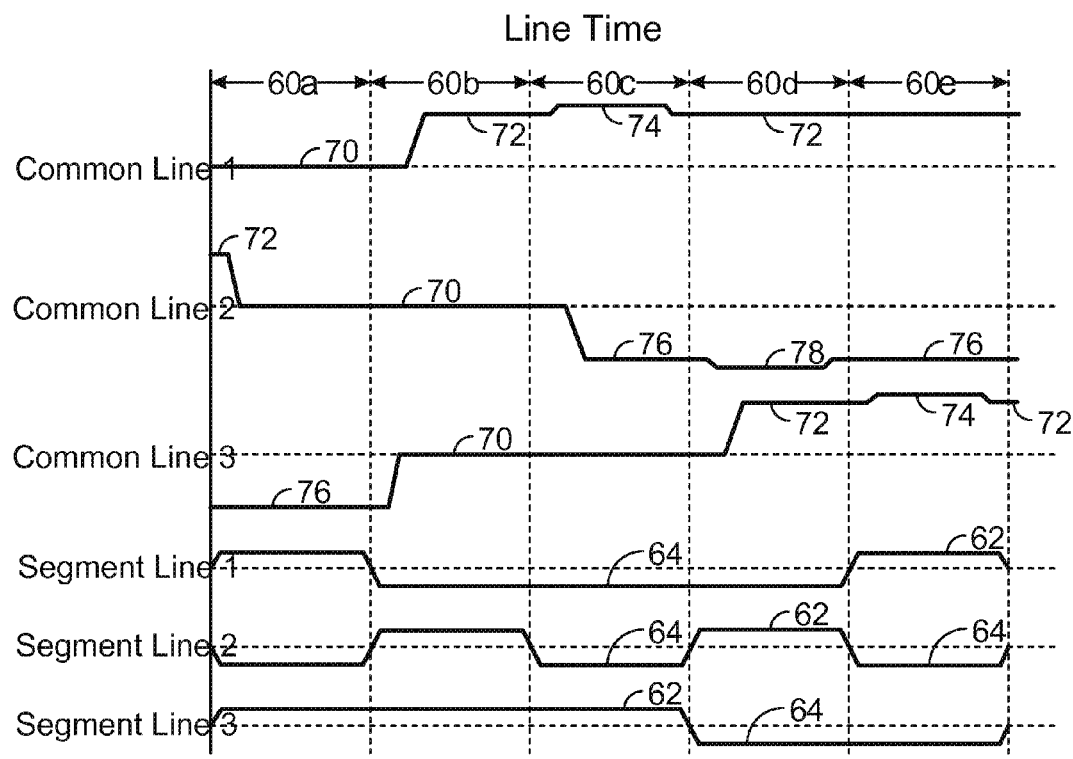
FIG. 5B shows an example of a timing diagram for common and segment signals that may be used to write the frame of display data illustrated in FIG. 5A.

FIG. 5A shows an example of a diagram illustrating a frame of display data in the 3×3 interferometric modulator display of FIG. 2. FIG. 5B shows an example of a timing diagram for common and segment signals that may be used to write the frame of display data illustrated in FIG. 5A. The signals can be applied to the, e.g., 3×3 array of FIG. 2, which will ultimately result in the line time 60e display arrangement illustrated in FIG. 5A. The actuated modulators in FIG. 5A are in a dark-state, i.e., where a substantial portion of the reflected light is outside of the visible spectrum so as to result in a dark appearance to, e.g., a viewer. Prior to writing the frame illustrated in FIG. 5A, the pixels can be in any state, but the write procedure illustrated in the timing diagram of FIG. 5B presumes that each modulator has been released and resides in an unactuated state before the first line time 60a.

During the first line time 60a: a release voltage 70 is applied on common line 1; the voltage applied on common line 2 begins at a high hold voltage 72 and moves to a release voltage 70; and a low hold voltage 76 is applied along common line 3. Thus, the modulators (common 1, segment 1), (1,2) and (1,3) along common line 1 remain in a relaxed, or unactuated, state for the duration of the first line time 60a, the modulators (2,1), (2,2) and (2,3) along common line 2 will move to a relaxed state, and the modulators (3,1), (3,2) and (3,3) along common line 3 will remain in their previous state. With reference to FIG. 4, the segment voltages applied along segment lines 1, 2 and 3 will have no effect on the state of the interferometric modulators, as none of common lines 1, 2 or 3 are being exposed to voltage levels causing actuation during line time 60a (i.e., $VC_{REL}$-relax and $VC_{HOLD\_L}$-stable).

During the second line time 60b, the voltage on common line 1 moves to a high hold voltage 72, and all modulators along common line 1 remain in a relaxed state regardless of the segment voltage applied because no addressing, or actuation, voltage was applied on the common line 1. The modulators along common line 2 remain in a relaxed state due to the application of the release voltage 70, and the modulators (3,1), (3,2) and (3,3) along common line 3 will relax when the voltage along common line 3 moves to a release voltage 70.

During the third line time 60c, common line 1 is addressed by applying a high address voltage 74 on common line 1. Because a low segment voltage 64 is applied along segment lines 1 and 2 during the application of this address voltage, the pixel voltage across modulators (1,1) and (1,2) is greater than the high end of the positive stability window (i.e., the voltage differential exceeded a predefined threshold) of the modulators, and the modulators (1,1) and (1,2) are actuated. Conversely, because a high segment voltage 62 is applied along segment line 3, the pixel voltage across modulator (1,3) is less than that of modulators (1,1) and (1,2), and remains within the positive stability window of the modulator; modulator (1,3) thus remains relaxed. Also during line time 60c, the voltage along common line 2 decreases to a low hold voltage 76, and the voltage along common line 3 remains at a release voltage 70, leaving the modulators along common lines 2 and 3 in a relaxed position.

During the fourth line time 60d, the voltage on common line 1 returns to a high hold voltage 72, leaving the modulators along common line 1 in their respective addressed states. The voltage on common line 2 is decreased to a low address voltage 78. Because a high segment voltage 62 is applied along segment line 2, the pixel voltage across modulator (2,2) is below the lower end of the negative stability window of the modulator, causing the modulator (2,2) to actuate. Conversely, because a low segment voltage 64 is applied along segment lines 1 and 3, the modulators (2,1) and (2,3) remain in a relaxed position. The voltage on common line 3 increases to a high hold voltage 72, leaving the modulators along common line 3 in a relaxed state.

Finally, during the fifth line time 60e, the voltage on common line 1 remains at high hold voltage 72, and the voltage on common line 2 remains at a low hold voltage 76, leaving the modulators along common lines 1 and 2 in their respective addressed states. The voltage on common line 3 increases to a high address voltage 74 to address the modulators along common line 3. As a low segment voltage 64 is applied on segment lines 2 and 3, the modulators (3,2) and (3,3) actuate, while the high segment voltage 62 applied along segment line 1 causes modulator (3,1) to remain in a relaxed position. Thus, at the end of the fifth line time 60e, the 3×3 pixel array is in the state shown in FIG. 5A, and will remain in that state as long as the hold voltages are applied along the common lines, regardless of variations in the segment voltage which may occur when modulators along other common lines (not shown) are being addressed.

In the timing diagram of FIG. 5B, a given write procedure (i.e., line times 60a-60e) can include the use of either high hold and address voltages, or low hold and address voltages. Once the write procedure has been completed for a given common line (and the common voltage is set to the hold voltage having the same polarity as the actuation voltage), the pixel voltage remains within a given stability window, and does not pass through the relaxation window until a release voltage is applied on that common line. Furthermore, as each modulator is released as part of the write procedure prior to addressing the modulator, the actuation time of a modulator, rather than the release time, may determine the necessary line time. Specifically, in implementations in which the release time of a modulator is greater than the actuation time, the release voltage may be applied for longer than a single line time, as depicted in FIG. 5B. In some other implementations, voltages applied along common lines or segment lines may vary to account for variations in the actuation and release voltages of different modulators, such as modulators of different colors.

Figure 6A:
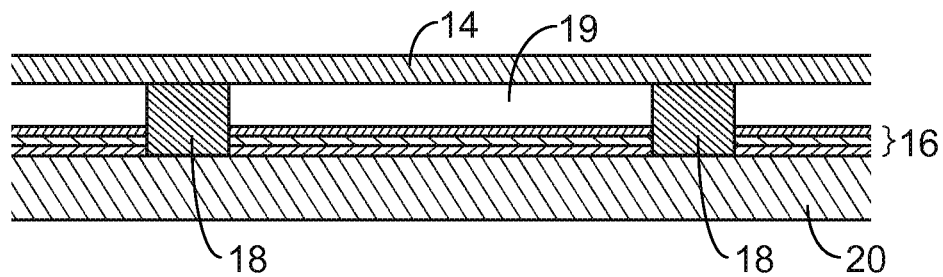
FIG. 6A shows an example of a partial cross-section of the interferometric modulator display of FIG. 1.
Figure 6B:
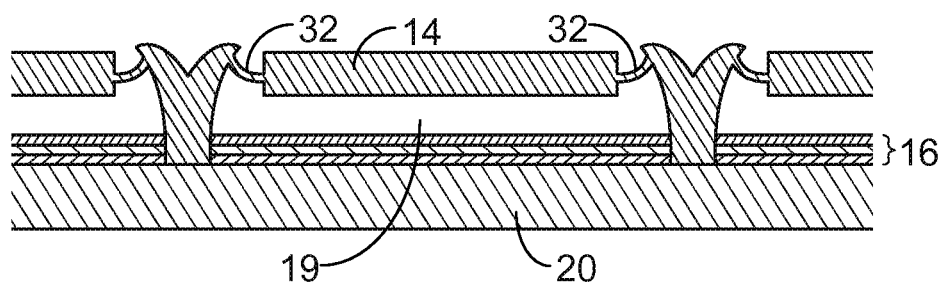
FIGS. 6B-6E show examples of cross-sections of varying implementations of interferometric modulators.
Figure 6C:
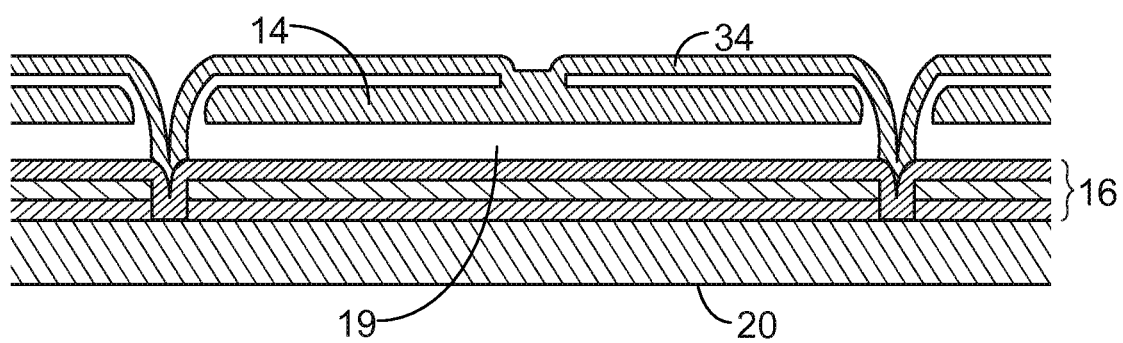

The details of the structure of interferometric modulators that operate in accordance with the principles set forth above may vary widely. For example, FIGS. 6A-6E show examples of cross-sections of varying implementations of interferometric modulators, including the movable reflective layer 14 and its supporting structures. FIG. 6A shows an example of a partial cross-section of the interferometric modulator display of FIG. 1, where a strip of metal material, i.e., the movable reflective layer 14 is deposited on supports 18 extending orthogonally from the substrate 20. In FIG. 6B, the movable reflective layer 14 of each IMOD is generally square or rectangular in shape and attached to supports at or near the corners, on tethers 32. In FIG. 6C, the movable reflective layer 14 is generally square or rectangular in shape and suspended from a deformable layer 34, which may include a flexible metal. The deformable layer 34 can connect, directly or indirectly, to the substrate 20 around the perimeter of the movable reflective layer 14. These connections are herein referred to as support posts. The implementation shown in FIG. 6C has additional benefits deriving from the decoupling of the optical functions of the movable reflective layer 14 from its mechanical functions, which are carried out by the deformable layer 34. This decoupling allows the structural design and materials used for the reflective layer 14 and those used for the deformable layer 34 to be optimized independently of one another.

Figure 6D:
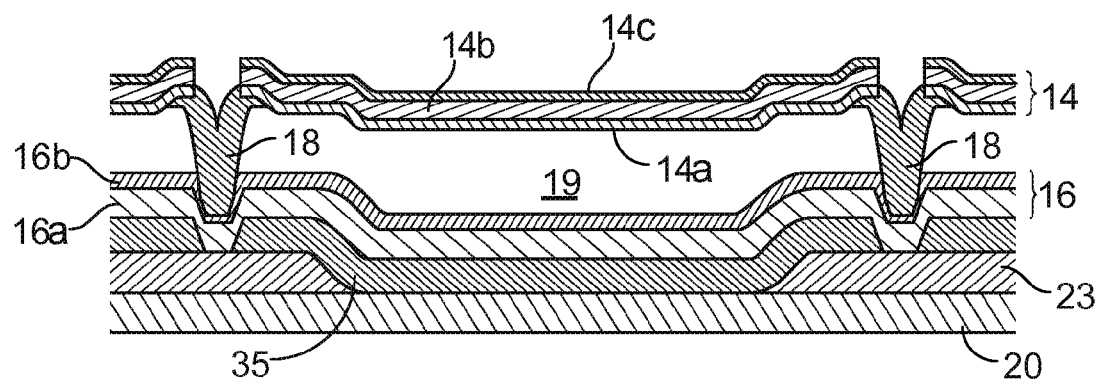

FIG. 6D shows another example of an IMOD, where the movable reflective layer 14 includes a reflective sub-layer 14a. The movable reflective layer 14 rests on a support structure, such as support posts 18. The support posts 18 provide separation of the movable reflective layer 14 from the lower stationary electrode (i.e., part of the optical stack 16 in the illustrated IMOD) so that a gap 19 is formed between the movable reflective layer 14 and the optical stack 16, for example when the movable reflective layer 14 is in a relaxed position. The movable reflective layer 14 also can include a conductive layer 14c, which may be configured to serve as an electrode, and a support layer 14b. In this example, the conductive layer 14c is disposed on one side of the support layer 14b, distal from the substrate 20, and the reflective sub-layer 14a is disposed on the other side of the support layer 14b, proximal to the substrate 20. In some implementations, the reflective sub-layer 14a can be conductive and can be disposed between the support layer 14b and the optical stack 16. The support layer 14b can include one or more layers of a dielectric material, for example, silicon oxynitride (SiON) or silicon dioxide ($SiO_2$). In some implementations, the support layer 14b can be a stack of layers, such as, for example, a $SiO_2$/SiON/$SiO_2$ tri-layer stack. Either or both of the reflective sub-layer 14a and the conductive layer 14c can include, e.g., an aluminum (Al) alloy with about 0.5% copper (Cu), or another reflective metallic material. Employing conductive layers 14a, 14c above and below the dielectric support layer 14b can balance stresses and provide enhanced conduction. In some implementations, the reflective sub-layer 14a and the conductive layer 14c can be formed of different materials for a variety of design purposes, such as achieving specific stress profiles within the movable reflective layer 14.

As illustrated in FIG. 6D, some implementations also can include a black mask structure 23. The black mask structure 23 can be formed in optically inactive regions (e.g., between pixels or under posts 18) to absorb ambient or stray light. The black mask structure 23 also can improve the optical properties of a display device by inhibiting light from being reflected from or transmitted through inactive portions of the display, thereby increasing the contrast ratio. Additionally, the black mask structure 23 can be conductive and be configured to function as an electrical bussing layer. In some implementations, the row electrodes can be connected to the black mask structure 23 to reduce the resistance of the connected row electrode. The black mask structure 23 can be formed using a variety of methods, including deposition and patterning techniques. The black mask structure 23 can include one or more layers. For example, in some implementations, the black mask structure 23 includes a molybdenum-chromium (MoCr) layer that serves as an optical absorber, a $SiO_2$ layer, and an aluminum alloy that serves as a reflector and a bussing layer, with a thickness in the range of about 30-80 Å, 500-1000 Å, and 500-6000 Å, respectively. The one or more layers can be patterned using a variety of techniques, including photolithography and dry etching, including, for example, carbon tetrafluoromethane ($CF_4$) and/or oxygen ($O_2$) for the MoCr and $SiO_2$ layers and chlorine ($Cl_2$) and/or boron trichloride ($BCl_3$) for the aluminum alloy layer. In some implementations, the black mask 23 can be an etalon or interferometric stack structure. In such interferometric stack black mask structures 23, the conductive absorbers can be used to transmit or bus signals between lower, stationary electrodes in the optical stack 16 of each row or column. In some implementations, a spacer layer 35 can serve to generally electrically isolate the absorber layer 16a from the conductive layers in the black mask 23.

Figure 6E:
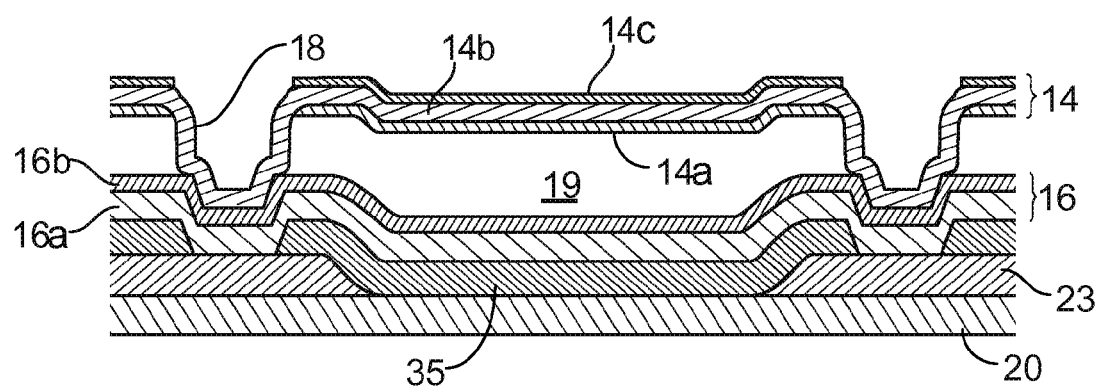

FIG. 6E shows another example of an IMOD, where the movable reflective layer 14 is self-supporting. In contrast with FIG. 6D, the implementation of FIG. 6E does not include support posts 18. Instead, the movable reflective layer 14 contacts the underlying optical stack 16 at multiple locations, and the curvature of the movable reflective layer 14 provides sufficient support that the movable reflective layer 14 returns to the unactuated position of FIG. 6E when the voltage across the interferometric modulator is insufficient to cause actuation. The optical stack 16, which may contain a plurality of several different layers, is shown here for clarity including an optical absorber 16a, and a dielectric 16b. In some implementations, the optical absorber 16a may serve both as a fixed electrode and as a partially reflective layer.

In implementations such as those shown in FIGS. 6A-6E, the IMODs function as direct-view devices, in which images are viewed from the front side of the transparent substrate 20, i.e., the side opposite to that upon which the modulator is arranged. In these implementations, the back portions of the device (that is, any portion of the display device behind the movable reflective layer 14, including, for example, the deformable layer 34 illustrated in FIG. 6C) can be configured and operated upon without impacting or negatively affecting the image quality of the display device, because the reflective layer 14 optically shields those portions of the device. For example, in some implementations a bus structure (not illustrated) can be included behind the movable reflective layer 14 which provides the ability to separate the optical properties of the modulator from the electromechanical properties of the modulator, such as voltage addressing and the movements that result from such addressing. Additionally, the implementations of FIGS. 6A-6E can simplify processing, such as patterning.

Figure 7:
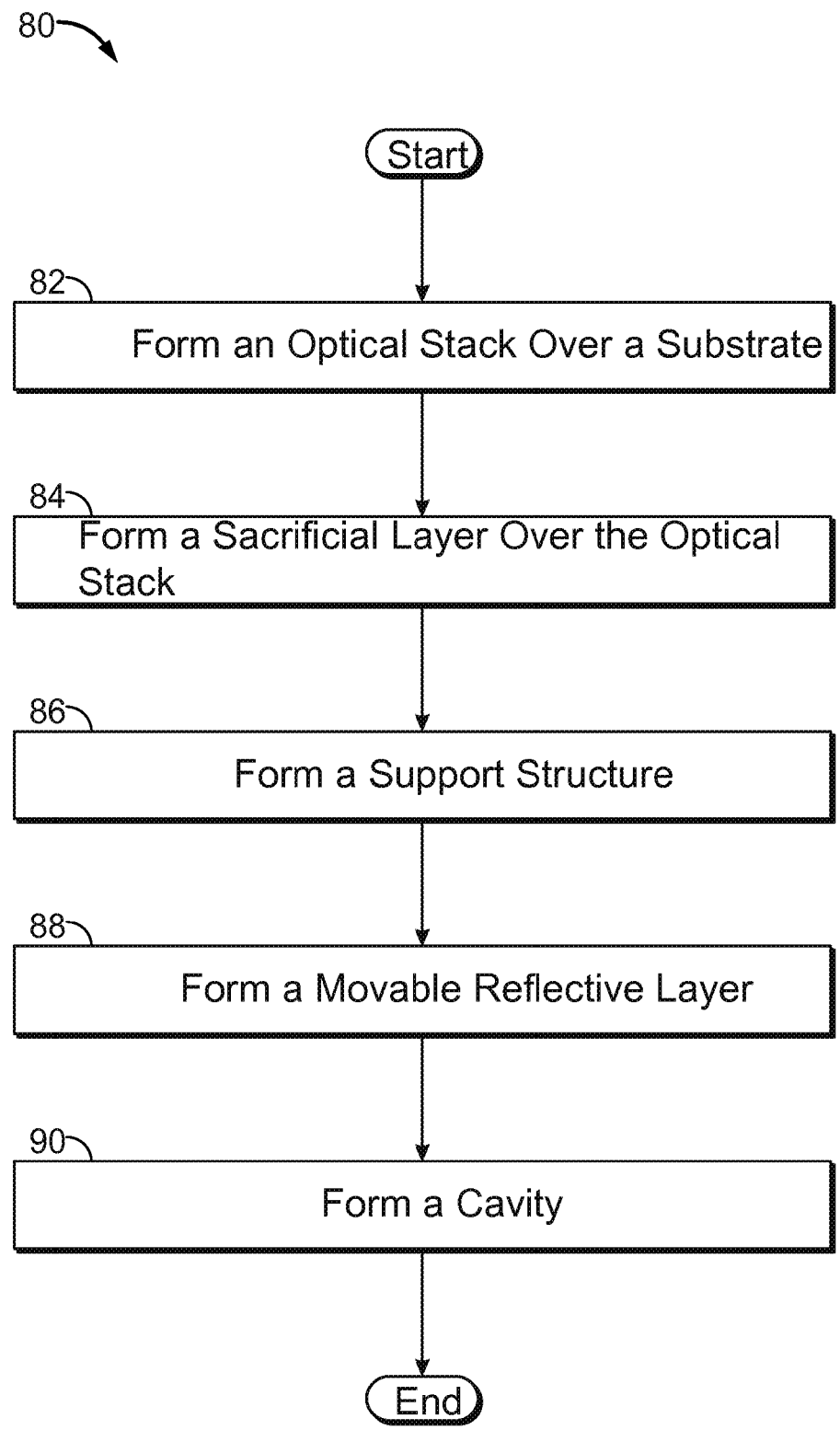
FIG. 7 shows an example of a flow diagram illustrating a manufacturing process for an interferometric modulator.
Figure 8A:
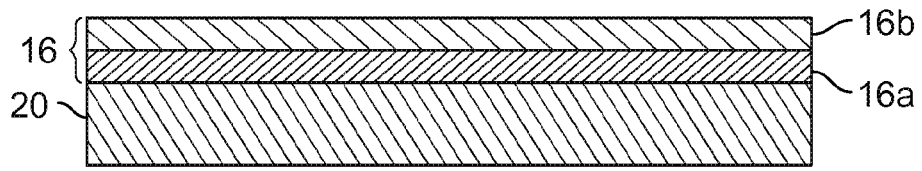
FIGS. 8A-8E show examples of cross-sectional schematic illustrations of various stages in a method of making an interferometric modulator.

FIG. 7 shows an example of a flow diagram illustrating a manufacturing process 80 for an interferometric modulator, and FIGS. 8A-8E show examples of cross-sectional schematic illustrations of corresponding stages of such a manufacturing process 80. In some implementations, the manufacturing process 80 can be implemented to manufacture, e.g., interferometric modulators of the general type illustrated in FIGS. 1 and 6, in addition to other blocks not shown in FIG. 7. With reference to FIGS. 1, 6 and 7, the process 80 begins at block 82 with the formation of the optical stack 16 over the substrate 20. FIG. 8A illustrates such an optical stack 16 formed over the substrate 20. The substrate 20 may be a transparent substrate such as glass or plastic, it may be flexible or relatively stiff and unbending, and may have been subjected to prior preparation processes, e.g., cleaning, to facilitate efficient formation of the optical stack 16. As discussed above, the optical stack 16 can be electrically conductive, partially transparent and partially reflective and may be fabricated, for example, by depositing one or more layers having the desired properties onto the transparent substrate 20. In FIG. 8A, the optical stack 16 includes a multilayer structure having sub-layers 16a and 16b, although more or fewer sub-layers may be included in some other implementations. In some implementations, one of the sub-layers 16a, 16b can be configured with both optically absorptive and conductive properties, such as the combined conductor/absorber sub-layer 16a. Additionally, one or more of the sub-layers 16a, 16b can be patterned into parallel strips, and may form row electrodes in a display device. Such patterning can be performed by a masking and etching process or another suitable process known in the art. In some implementations, one of the sub-layers 16a, 16b can be an insulating or dielectric layer, such as sub-layer 16b that is deposited over one or more metal layers (e.g., one or more reflective and/or conductive layers). In addition, the optical stack 16 can be patterned into individual and parallel strips that form the rows of the display.

Figure 8B:
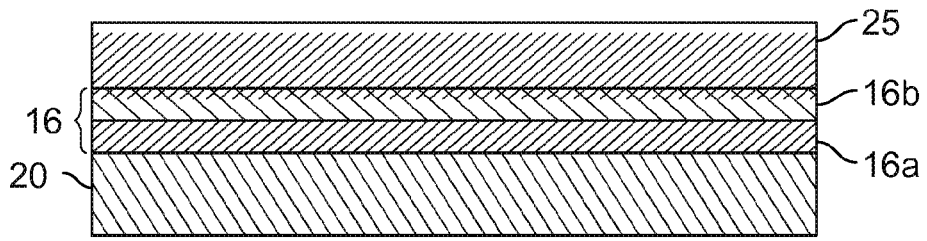

The process 80 continues at block 84 with the formation of a sacrificial layer 25 over the optical stack 16. The sacrificial layer 25 is later removed (e.g., at block 90) to form the cavity 19 and thus the sacrificial layer 25 is not shown in the resulting interferometric modulators 12 illustrated in FIG. 1. FIG. 8B illustrates a partially fabricated device including a sacrificial layer 25 formed over the optical stack 16. The formation of the sacrificial layer 25 over the optical stack 16 may include deposition of a xenon difluoride ($XeF_2$)-etchable material such as molybdenum (Mo) or amorphous silicon (Si), in a thickness selected to provide, after subsequent removal, a gap or cavity 19 (see also FIGS. 1 and 8E) having a desired design size. Deposition of the sacrificial material may be carried out using deposition techniques such as physical vapor deposition (PVD, e.g., sputtering), plasma-enhanced chemical vapor deposition (PECVD), thermal chemical vapor deposition (thermal CVD), or spin-coating.

Figure 8C:
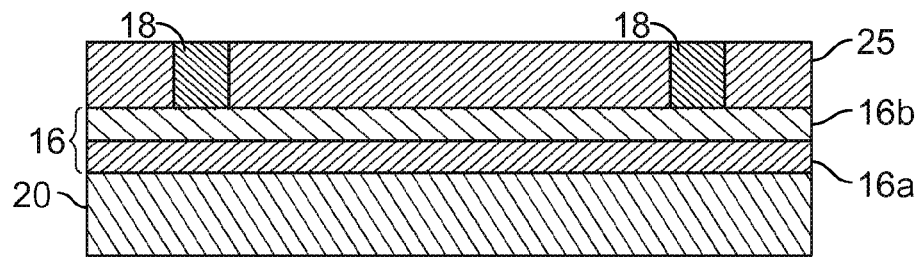

The process 80 continues at block 86 with the formation of a support structure e.g., a post 18 as illustrated in FIGS. 1, 6 and 8C. The formation of the post 18 may include patterning the sacrificial layer 25 to form a support structure aperture, then depositing a material (e.g., a polymer or an inorganic material, e.g., silicon oxide) into the aperture to form the post 18, using a deposition method such as PVD, PECVD, thermal CVD, or spin-coating. In some implementations, the support structure aperture formed in the sacrificial layer can extend through both the sacrificial layer 25 and the optical stack 16 to the underlying substrate 20, so that the lower end of the post 18 contacts the substrate 20 as illustrated in FIG. 6A. Alternatively, as depicted in FIG. 8C, the aperture formed in the sacrificial layer 25 can extend through the sacrificial layer 25, but not through the optical stack 16. For example, FIG. 8E illustrates the lower ends of the support posts 18 in contact with an upper surface of the optical stack 16. The post 18, or other support structures, may be formed by depositing a layer of support structure material over the sacrificial layer 25 and patterning portions of the support structure material located away from apertures in the sacrificial layer 25. The support structures may be located within the apertures, as illustrated in FIG. 8C, but also can, at least partially, extend over a portion of the sacrificial layer 25. As noted above, the patterning of the sacrificial layer 25 and/or the support posts 18 can be performed by a patterning and etching process, but also may be performed by alternative etching methods.

Figure 8D:
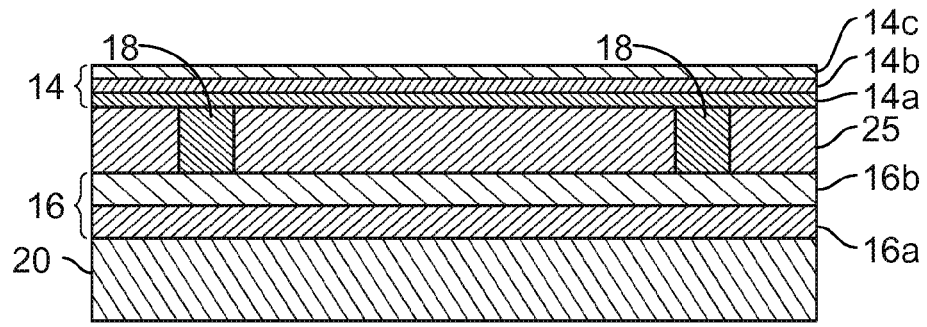
Figure 8E:
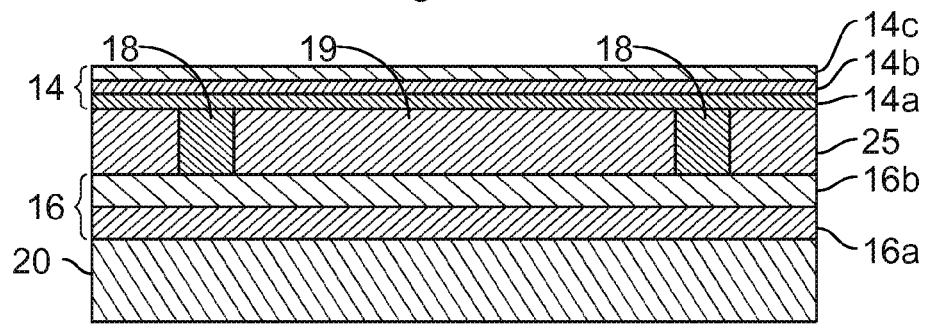

The process 80 continues at block 88 with the formation of a movable reflective layer or membrane such as the movable reflective layer 14 illustrated in FIGS. 1, 6 and 8D. The movable reflective layer 14 may be formed by employing one or more deposition steps, e.g., reflective layer (e.g., aluminum, aluminum alloy) deposition, along with one or more patterning, masking, and/or etching steps. The movable reflective layer 14 can be electrically conductive, and referred to as an electrically conductive layer. In some implementations, the movable reflective layer 14 may include a plurality of sub-layers 14a, 14b, 14c as shown in FIG. 8D. In some implementations, one or more of the sub-layers, such as sub-layers 14a, 14c, may include highly reflective sub-layers selected for their optical properties, and another sub-layer 14b may include a mechanical sub-layer selected for its mechanical properties. Since the sacrificial layer 25 is still present in the partially fabricated interferometric modulator formed at block 88, the movable reflective layer 14 is typically not movable at this stage. A partially fabricated IMOD that contains a sacrificial layer 25 also may be referred to herein as an "unreleased" IMOD. As described above in connection with FIG. 1, the movable reflective layer 14 can be patterned into individual and parallel strips that form the columns of the display.

The process 80 continues at block 90 with the formation of a cavity, e.g., cavity 19 as illustrated in FIGS. 1, 6 and 8E. The cavity 19 may be formed by exposing the sacrificial material 25 (deposited at block 84) to an etchant. For example, an etchable sacrificial material such as molybdenum (Mo) or amorphous silicon (Si) may be removed by dry chemical etching, e.g., by exposing the sacrificial layer 25 to a gaseous or vaporous etchant, such as vapors derived from solid $XeF_2$ for a period of time that is effective to remove the desired amount of material, typically selectively removed relative to the structures surrounding the cavity 19. Other etching methods, e.g. wet etching and/or plasma etching, also may be used. Since the sacrificial layer 25 is removed during block 90, the movable reflective layer 14 is typically movable after this stage. After removal of the sacrificial material 25, the resulting fully or partially fabricated IMOD may be referred to herein as a "released" IMOD.

Figure 9:
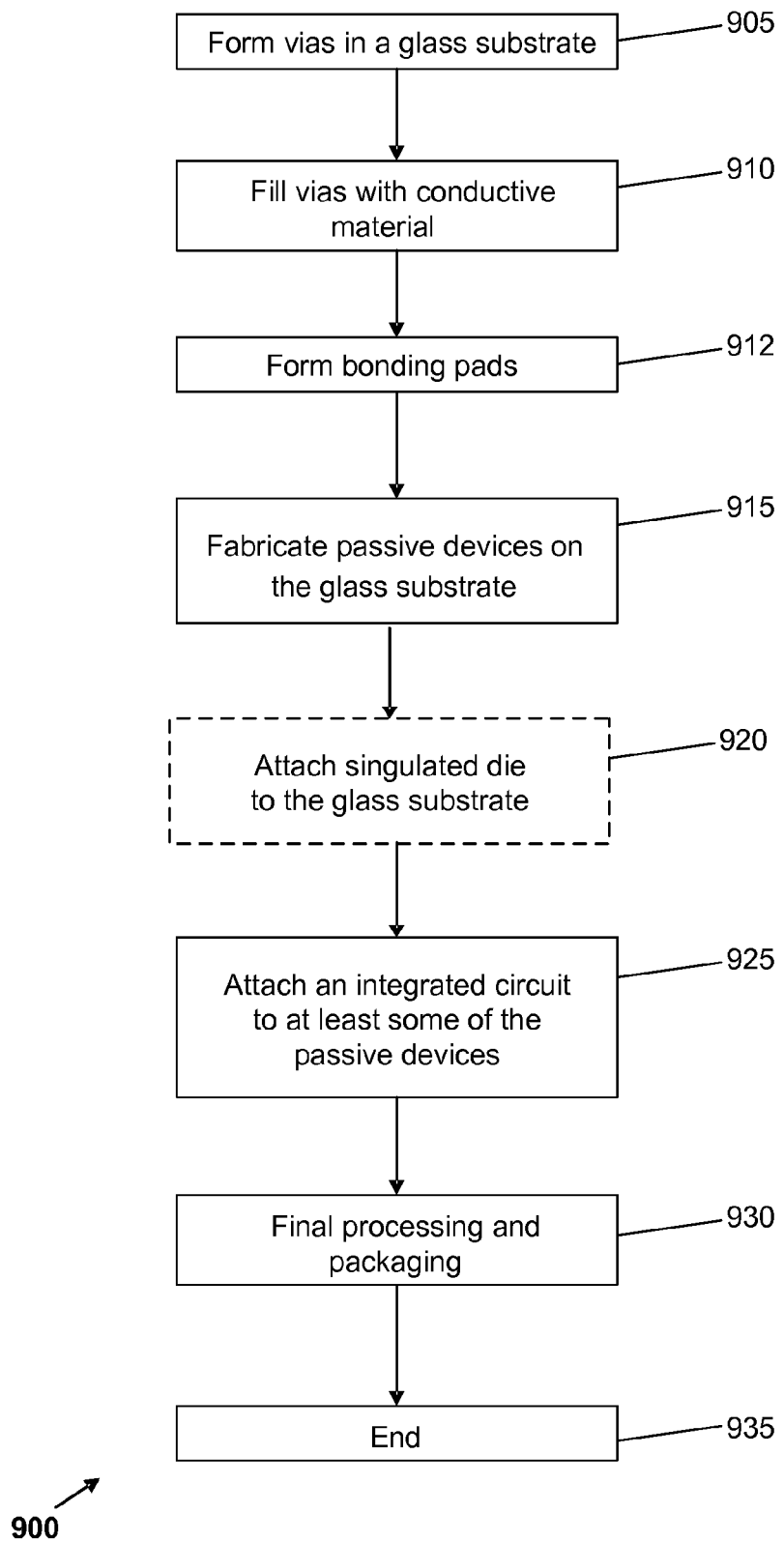
FIG. 9 shows an example of a flow diagram illustrating a process of forming an apparatus that includes an integrated circuit combined with passive devices formed on a glass substrate.

FIG. 9 shows an example of a flow diagram illustrating a process of forming an apparatus that includes an integrated circuit combined with passive devices formed on a glass substrate. The operations of process 900, as with other processes described herein, may involve more or fewer operations than are illustrated or expressly described. Moreover, the operations are not necessarily performed in the order indicated.

The integrated circuit may, for example, have been formed on a silicon-based substrate, such as an SOI substrate. In some implementations, the integrated circuit may have been formed on a silicon-based wafer according to a complementary metal-oxide-semiconductor (CMOS) process and then singulated into an individual "chip." Although in process 900 the integrated circuit is a power amplifier chip, this is merely an example that should not be construed as limiting in any way. For example, similar processes may be used to fabricate a low noise amplifier, a mixer, an active filter, a digital signal processor, a controller, a line driver, an optical transceiver, a wireless sensor, a power supply bias generation or regulation circuit, a phased-array circuit, an analog-to-digital or digital-to-analog converter, a memory, combinations thereof and/or other devices.

In this example, the glass substrate is processed before the integrated circuit or other features are added. In block 905, vias are formed in the glass substrate. These vias may be formed, for example, by laser drilling, by sandblasting, by etching, or by a combination of processes. In some implementations, the vias may be between 100 and 500 microns in diameter. In some other implementations, the vias may be made in other shapes or sizes. Moreover, in alternative implementations vias may be fabricated at a different stage of process 900, such as after block 912 or block 915.

In some implementations, block 905 may involve forming interconnect vias that can be configured for making an electrical connection through the glass substrate. Such interconnect vias may be filled with electrically conductive material in block 910. Electrically conductive bonding pads may be formed on or electrically connected to at least one end of the interconnect vias in block 912. Solder balls may be affixed to the bonding pads at this stage of the process 900 or at a later stage.

FIGS. 10A-10G show examples of components that may be formed according to the process of FIG. 9. In the example depicted in FIG. 10A, the interconnect vias 1010a are configured for making an electrical connection through the glass substrate 1007. Accordingly, passive devices 1025a, 1025b and 1025c that are formed on one side of the glass substrate 1007 may be configured for electrical connection with the bonding pads 1015 and the solder balls 1020 that are formed on the other side of the glass substrate 1007. However, in some implementations, at least some of the vias 1010 may not be configured for making an electrical connection through the glass substrate 1007. In some implementations, the glass substrate 1007 may be between 300 microns and 700 microns in thickness. In some other implementations, the glass substrate 1007 may be thicker or thinner.

Power amplifiers have high current requirements and may generate a substantial amount of heat. Therefore, forming a glass substrate with thermal vias 1010b can provide useful heat-dissipation functionality for implementations that include power amplifiers and/or other devices that generate a significant amount of heat. Though a glass substrate with thermal vias provides a substantial path for heat dissipation, in some implementations, the gap between the integrated circuit and the glass, and/or the gap between the glass and a printed circuit board, may be filled with an electrically insulating underfill material to further improve the thermal conductivity and reliability.

Accordingly, block 905 also may involve forming thermal vias that can be configured for conducting heat from one side of the glass substrate to the other side of the glass substrate. In some implementations, the thermal vias may not be used to conduct electricity from one side of the glass substrate to the other. In FIGS. 10A through 10G, for example, some of the thermal vias 1010b may not be configured to make an electrical connection through the glass substrate 1007. In some such implementations, the bonding pads 1015 and the solder balls 1020 may not be formed on one side of the glass substrate 1007 at the end of some of the thermal vias 1010b. One such example is thermal via 1010b1 of FIGS. 10A through 10C.

In FIGS. 10A through 10G, some of the thermal vias 1010b, such as thermal via 1010b1, appear to have approximately the same diameters as those of the interconnect vias 1010a. However, depending on the implementation, the vias need not be made into approximately the same shape or size. For example, in some implementations block 905 may involve forming the thermal vias 1010b with diameters that are larger than those of the interconnect vias 1010a.

One such example is thermal via 1010b2, which is depicted in FIGS. 10A through 10G. According to some such implementations, one or more thermal via 1010b2 may be formed with widths or diameters that are at least twice the diameters of the interconnect vias 1010a. In some implementations, the thermal vias 1010b2 may be formed with widths or diameters that are between twice as large and five times as large as the widths or diameters of the interconnect vias 1010a. In some such examples, the interconnect vias 1010a may have diameters of approximately 100 microns and the thermal vias 1010b may have widths or diameters in the range of approximately 200 microns to approximately 500 microns.

The vias 1010 are not necessarily circular in cross-section. In some implementations, at least some of the vias 1010 may be polygonal in cross-section. For example, in some implementations the vias 1010 may be hexagonal in cross-section. Hexagonally-shaped vias 1010 disposed adjacent to each other can enable a high packing density, like a honeycomb. Accordingly, hexagonally-shaped thermal vias 1010b can enhance the dissipation of heat.

In some implementations, one or more vias 1010 may function to simultaneously conduct electrical signals and provide thermal heat conduction. In some implementations, one or more vias 1010 may be used to thermally isolate portions of the glass substrate 1007 or electrically isolate portions of the glass substrate 1007 by grounding. Block 910 may involve filling the thermal vias with thermally conductive material, which may or may not be the same material used to fill the interconnect vias. The thermal vias 1010b may or may not be filled with electrically conductive material. For example, a thermally conductive film, such as a film of diamond-like carbon, may be deposited in the thermal vias 1010b using a vacuum deposition process. Such films can be made thermally conductive but not electrically conductive. However, it is simpler to use the same material to fill interconnect vias 1010a and thermal vias 1010b. Other materials that may be used to fill the vias include, for example, copper, solder (which may be in paste form) and/or epoxy. For example, in some implementations, at least some of the vias may be filled with a paste that includes a combination of epoxy and solder, or with a paste that includes a combination of epoxy, solder and copper particles. However, other conductive materials such as gold (Au), silver (Ag), aluminum, etc., may be used instead of copper (or in addition to copper). If the thermal vias 1010b are filled with electrically conductive material, such thermal vias 1010b may be made electrically grounded or floating.

In some implementations, block 910 may involve metalizing the side walls of through-glass vias by sputtering, chemical vapor deposition (CVD), electroless plating or another such process. The vias may then be filled with a conductive metal, such as copper, via electroplating. In some implementations, via walls may be plated with nickel (Ni) and/or gold. The cores of the vias may be filled with polymer, paste with conductive and non-conductive fillers, solder, or some combination thereof. The vias may be filled with plated copper and capped with nickel and gold. In some implementations, the filling process may not entirely fill the vias. For example, some implementations may involve forming conductive walls on the vias but not completely filling the vias with conductive material. Some such implementations may involve forming annular conductive rings in the vias. Excess metal on the glass substrate may be removed, for example, by etching and/or chemical mechanical polishing/planarization (CMP). In some implementations, electrically conductive bonding pads (such as the bonding pads 1015 depicted in FIGS. 10A through 10G) may be formed on at least one end of the interconnect vias by selectively removing such excess metal (see Block 912).

In some alternative implementations, the vias may be filled by other processes after the side walls are metalized. The filling process may involve filling the vias by applying a solder paste, by applying a combination of epoxy and solder or by applying a combination of epoxy, copper and solder. For example, the vias may be filled by screen-printing of one or more pastes, which may be selected from the pastes described above. After the vias are filled with paste, the process 900 may include a reflow soldering process to melt the solder and create conducting and filled through-glass vias without overheating and damaging other components.

In some other alternative implementations, the process 900 may begin by receiving a glass substrate that has pre-formed vias, pre-filled vias and/or bonding pads. In such implementations, one or more of blocks 905 through 912 may be omitted. In some implementations, such pre-formed vias may be formed as described herein. Alternatively, or additionally, such pre-formed vias may include tungsten (W) wire, doped silicon and/or plated metal.

In block 915, passive components such as resistors, capacitors, variable capacitors, varactors, inductors, filters, transformers, couplers, directional couplers, power splitters, transmission lines, waveguides, and/or antennas, are deposited on at least one side of the glass substrate 1007. Some examples of forming active and passive components on a glass substrate are described below with reference to FIGS. 13 and 14A et seq.

Figure 11A:
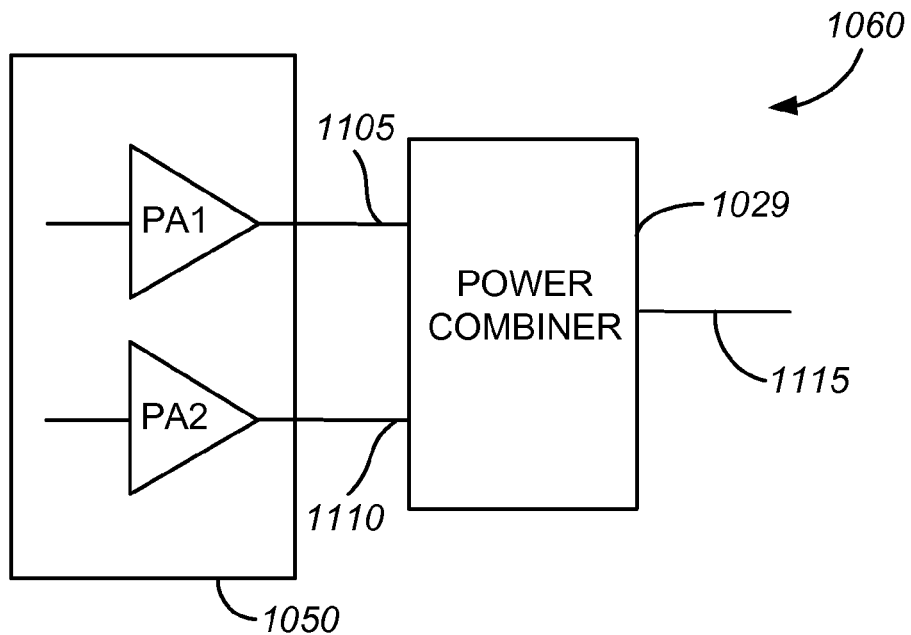
FIG. 11A shows an example of a power amplification system that includes a power amplifier chip and a power combiner circuit.
Figure 11B:
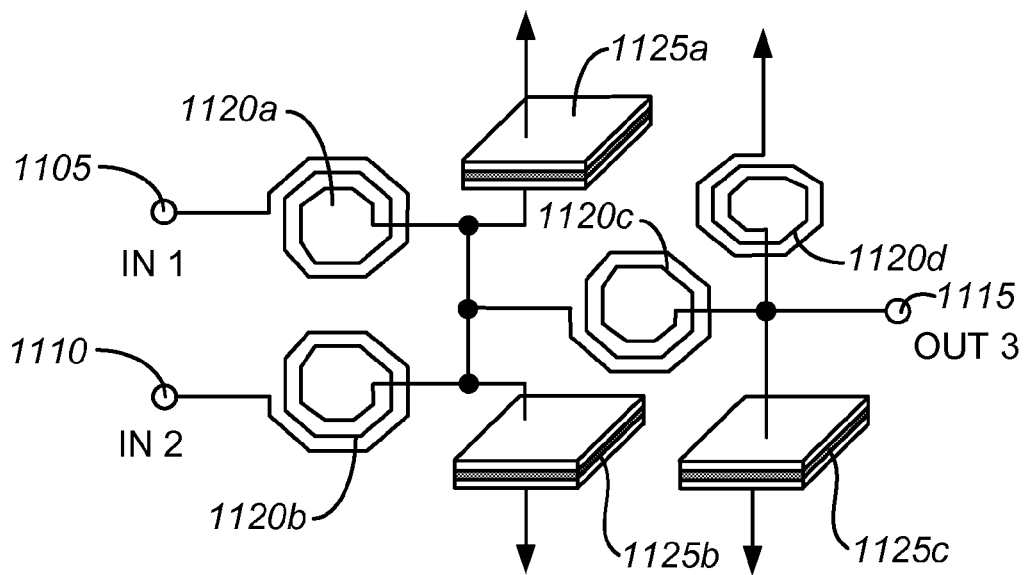
FIG. 11B shows examples of passive devices that may be used in a power combiner circuit.
Figure 11C:
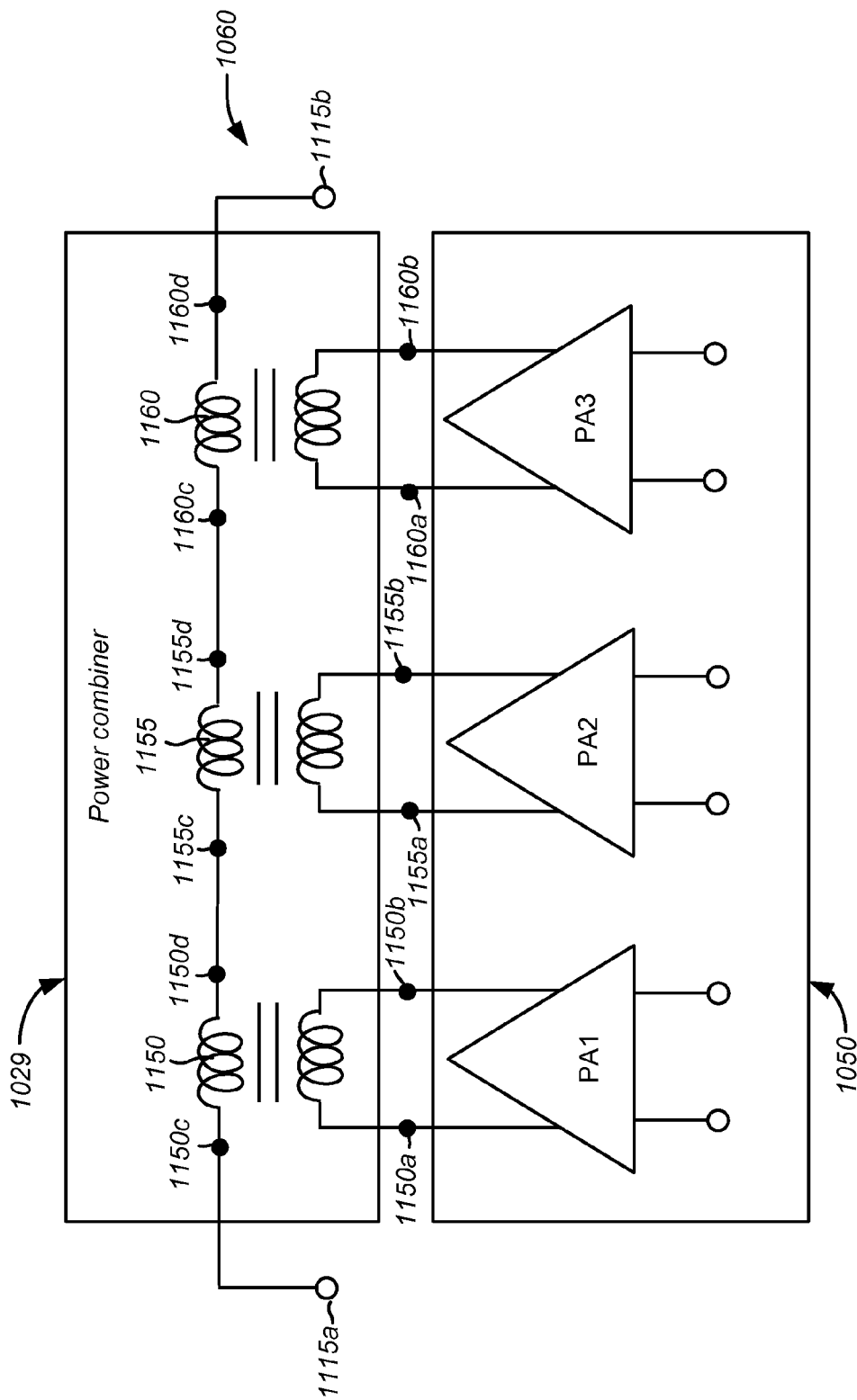
FIG. 11C shows another example of a power amplification system.

In some implementations, passive components deposited on a glass substrate may be used to form a power combiner circuit 1029, examples of which are depicted in FIGS. 11A through 11C and described below. Here, the power combiner circuit 1029 is configured for electrical communication with the interconnect vias 1010a. However, in some other implementations, block 915 (FIG. 9) may involve forming other passive components and/or active components on the glass substrate. For example, block 915 may involve forming resistors, inductors, capacitors, diodes, transistors, etc. These components may be used to form a variety of devices, such as a receive/transmit radio. Transferring the passives to the glass allows additional degrees of freedom with respect to the position of the passives.

In an optional block 920, single or multiple die (which may be singulated from one or more types of substrates, including but not limited to semiconducting substrates and glass substrates) can be attached to the glass substrate which has passive and/or active components and through-glass via interconnects.

In block 925, an integrated circuit is attached to at least some of the passive components. The integrated circuit also may be configured for electrical communication with the passive components. In some implementations, the integrated circuit and passive devices may be combined to form a low noise amplifier, a mixer, an active filter, a digital signal processor, a controller, a line driver, an optical transceiver, a wireless sensor, a power supply bias generation or regulation circuit, a phased-array circuit, an analog-to-digital or digital-to-analog converter, a memory, combinations thereof and/or other devices.

However, in this example, a power amplifier chip is configured for electrical connection with a power combiner circuit to form a power amplification system. In some such implementations, block 925 may involve stacking the power amplifier chip on the power combiner circuit. Stacked implementations may be advantageous because they provide an additional degree of freedom to design the solder balls, through-glass vias, passive components, and active elements in order to optimize the overall performance of the power amplification system.

For example, in some stacked implementations, passives on glass can have the following advantages compared to passives on the power amplification chip or on a printed circuit board: higher Q, greater accuracy, stability, and tolerance, lower parasitics, higher reliability, and lower cost. In some stacked implementations, the solder balls, passive components, active elements, and through-glass vias can be configured to reduce loss and minimize undesired coupling between electrical terminals of the power amplification system, thus providing higher electrical isolation. In some stacked implementations, the solder balls, passive components, active elements, and through-glass vias are configured to precisely control impedance levels and trace lengths of electrical interconnect of the power amplification system. Minimizing electrical line lengths can reduce the coupling of noise and reduce return and insertion losses. Reducing losses can further reduce heat generated in the system, in turn improving reliability and the overall performance of the power amplification system. In some implementations, isolating the passive devices from heat generated from the power amplifier chip can improve reliability or component stability.

Moreover, in some implementations, stacking also can reduce the overall area or footprint of the power amplification system. In some implementations, stacking elevates the power combiner passives and active circuitry above a printed circuit board (PCB) which can reduce coupled noise or losses from parasitics of the PCB or other peripheral circuit elements.

Some such examples are shown in FIGS. 10A through 10G. In some of these examples, the integrated circuit die is a power amplifier chip 1050, however a person having ordinary skill in the art will readily recognize that the integrated circuit die may include, one or more other electronic components, in some other implementations. The power amplifier chip 1050 may be a CMOS chip that has been configured for flip-chip bonding. In the example shown in FIG. 10A, the power amplifier chip 1050 has solder bumps 1055 that have been deposited onto electrically conductive chip pads 1052 of the power amplifier chip 1050. For example, the solder bumps 1055 may have been deposited on the chip pads 1052 on the top side of the wafer during a wafer processing step.

In order to mount the power amplifier chip 1050 to the power combiner circuit 1029, the power amplifier chip 1050 may be flipped over so that its top side faces down. The solder bumps 1055 may be aligned with, and brought into contact with conductive pads on the top of the power combiner circuit 1029.

Figure 10A:
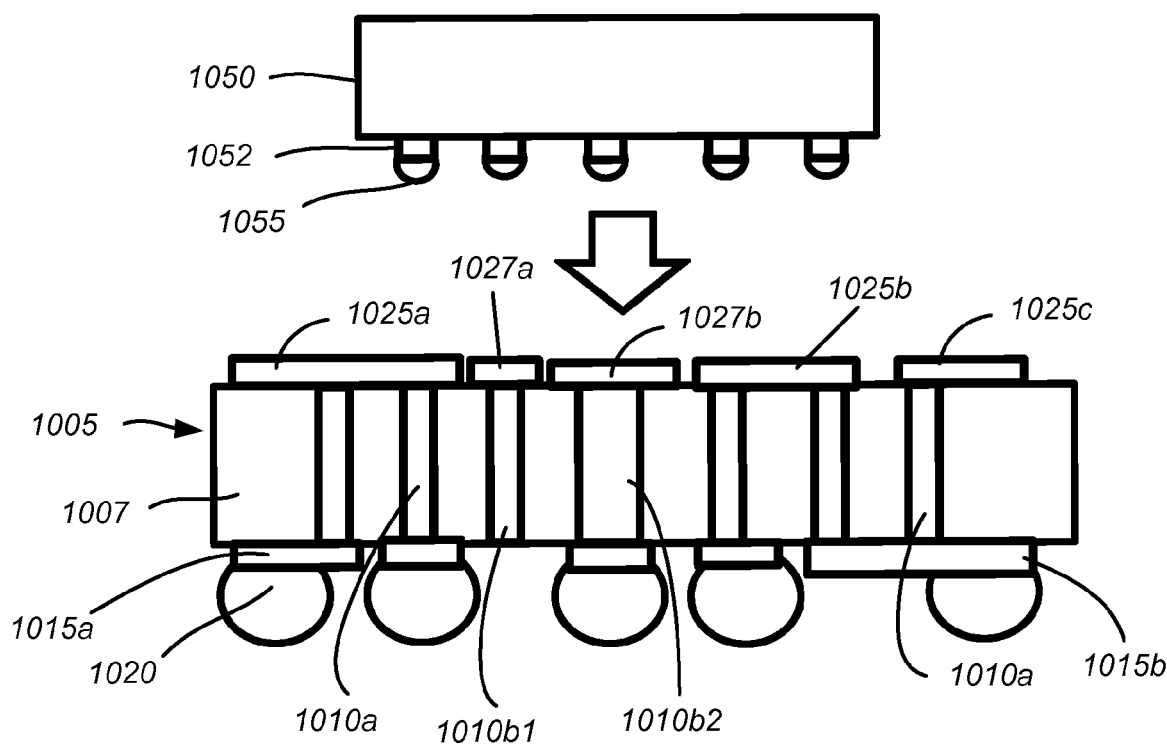
FIGS. 10A-10G show examples of components that may be formed according to the process of FIG. 9.
Figure 10B:
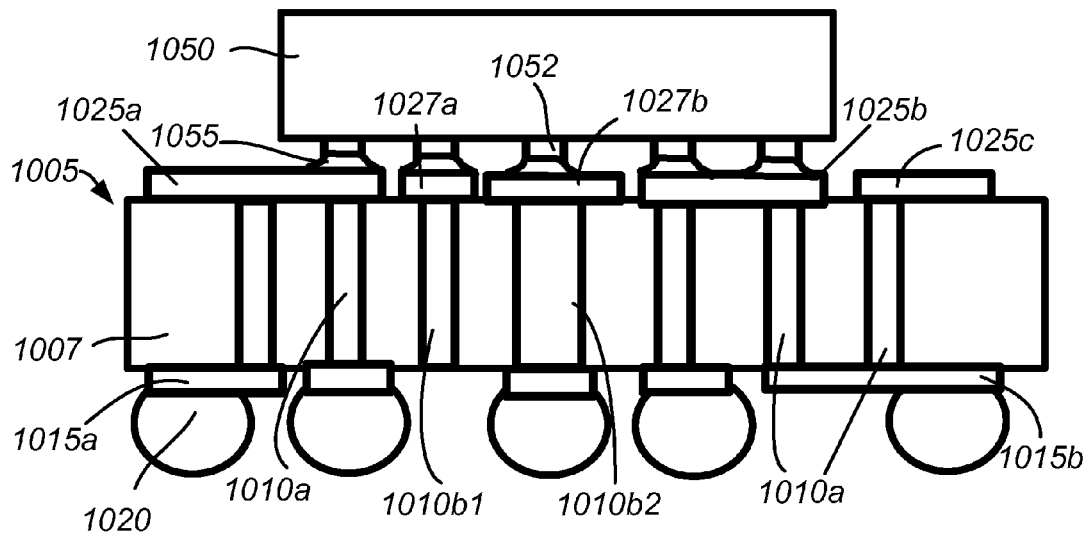

Referring to FIG. 10B, it may be seen that some of the solder bumps 1055 are brought into contact with passive devices 1025a and 1025b. The passive devices 1025a and 1025b are electrically connected to the bonding pads 1015a and 1015b, respectively, via the interconnect vias 1010a. Accordingly, after the solder of the solder bumps 1055 has been flowed to form an electrical and physical connection between the power amplifier chip 1050 and the power combiner circuit 1029, the resulting power amplification system 1060 is configured for electrical connectivity with the solder balls 1020.

Figure 10C:
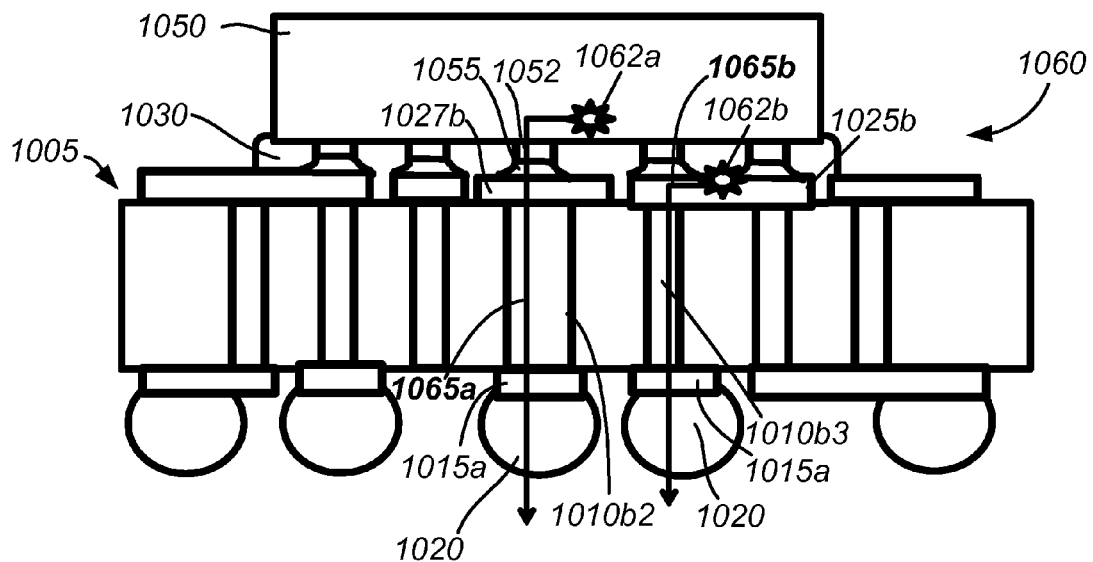

In this example, other solder bumps 1055 are connected with conductive pads 1027a and 1027b. The pads 1027a and 1027b, as well as the thermal vias 1010b, are made of thermally conductive material that may or may not be electrically conductive, depending on the implementation. As shown in FIG. 10C, the thermally conductive pathways 1065a and 1065b can provide efficient dissipation of heat from the hot spots 1062a and 1062b, respectively, to an attached PCB or other device. The thermally conductive pathway 1065a includes the electrically conductive chip pad 1052, the solder bump 1055, the pad 1027b, the thermal via 1010b2, one of the bonding pads 1015a and one of the solder balls 1020. The thermally conductive pathway 1065b includes the passive device 1025b, the thermal via 1010b3, one of the bonding pads 1015a and one of the solder balls 1020. The solder balls 1020 may be mounted on a heat sink, such as a corresponding portion of a PCB. The connection between the integrated circuit die and the substrate 1007 may be made stronger by filling gaps between the power amplifier chip 1050 and the power combiner circuit 1029, e.g., by underfilling with an electrically insulating adhesive material 1030.

Figure 10D:
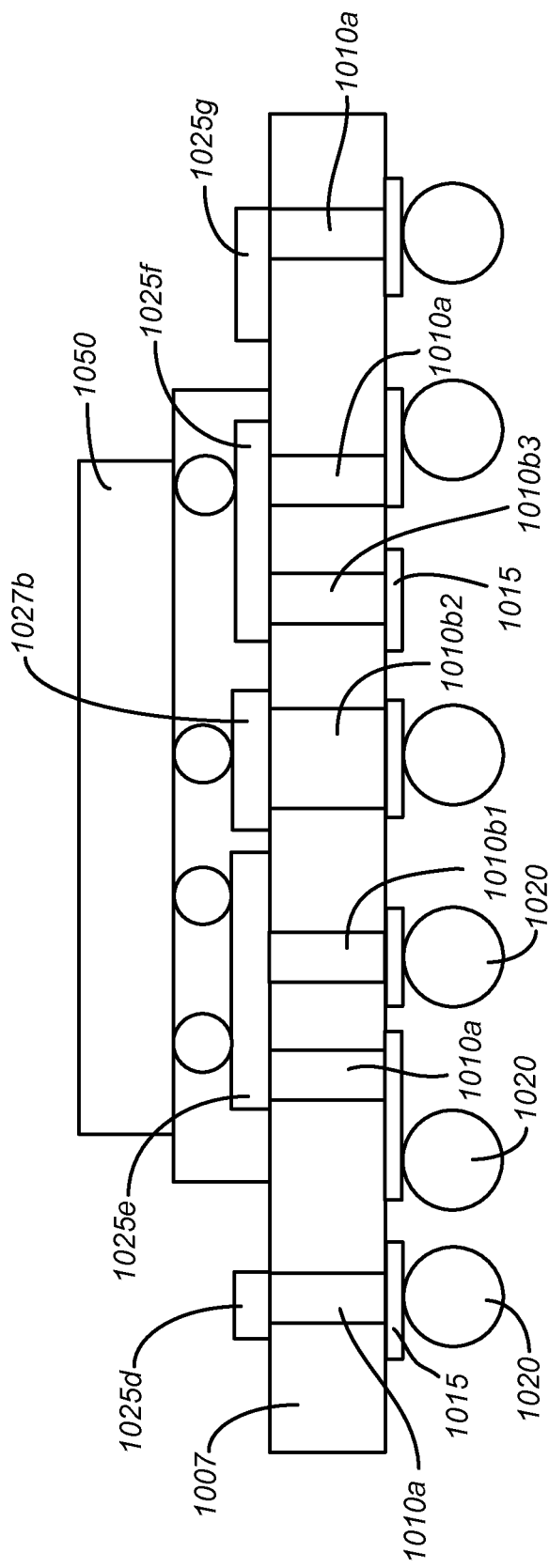

FIG. 10D shows an alternative implementation. In this example, the interconnect vias 1010a form an electrical connection between the passive devices 1025d and 1025e, the conductive pads 1015 and the solder balls 1020. The thermal vias 1010b1 and 1010b2 are configured to form thermally conductive pathways to corresponding solder balls 1020, which may be attached to a heat sink such as a PCB. The thermal via 1010b3 forms a thermally conductive pathway between the passive device 1025f and one of the conductive pads 1015, which has no attached solder ball 1020 in this example. One of the interconnect vias 1010a forms an electrical connection from the passive device 1025f through the glass substrate 1007. In this example, another one of the interconnect vias 1010a forms an electrical connection and a thermally conductive pathway from the passive device 1025g through the glass substrate 1007.

Figure 10E:
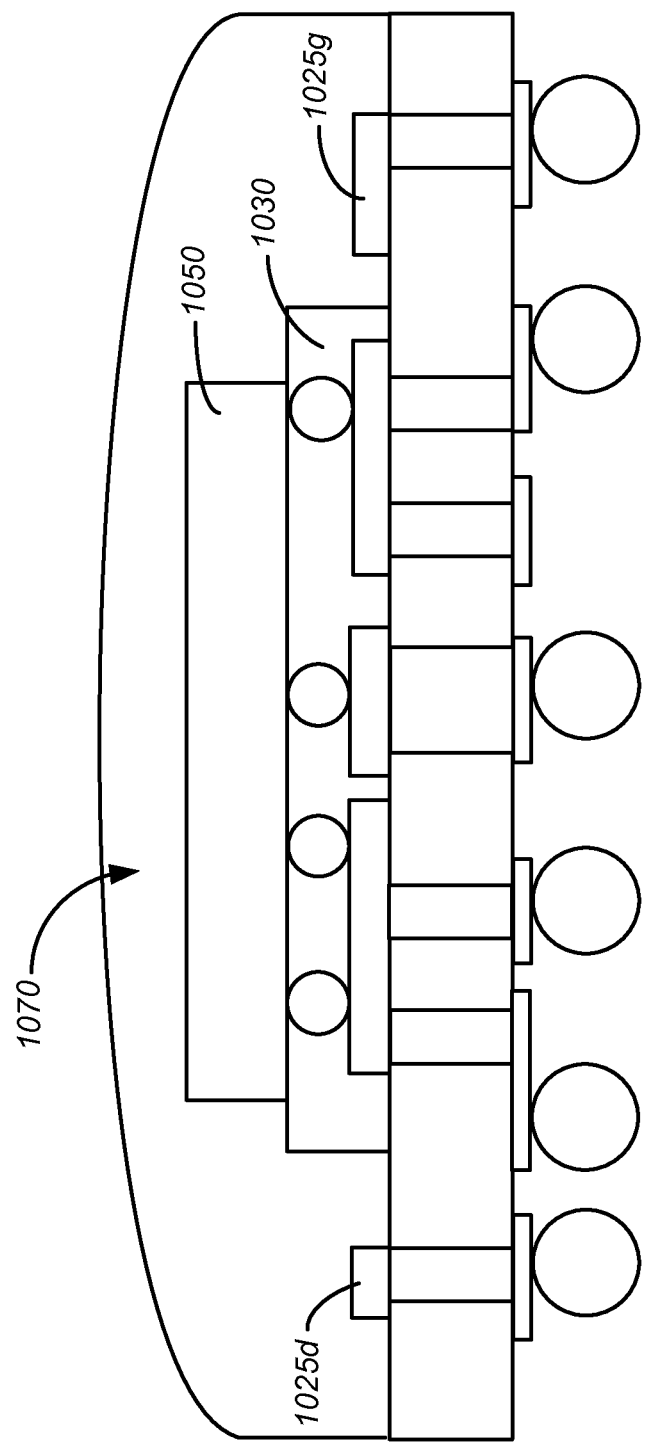

Block 930 may involve various types of final processing, packaging, etc., according to the particular implementation. Block 930 may, for example, involve enclosing the power amplifier chip 1050 and/or the glass die 1005. In some implementations, as shown in FIG. 10E, the enclosure can consist of a molding 1070. The molding 1070 may, for example, be an epoxy molding or another such molding.

Figure 10F:
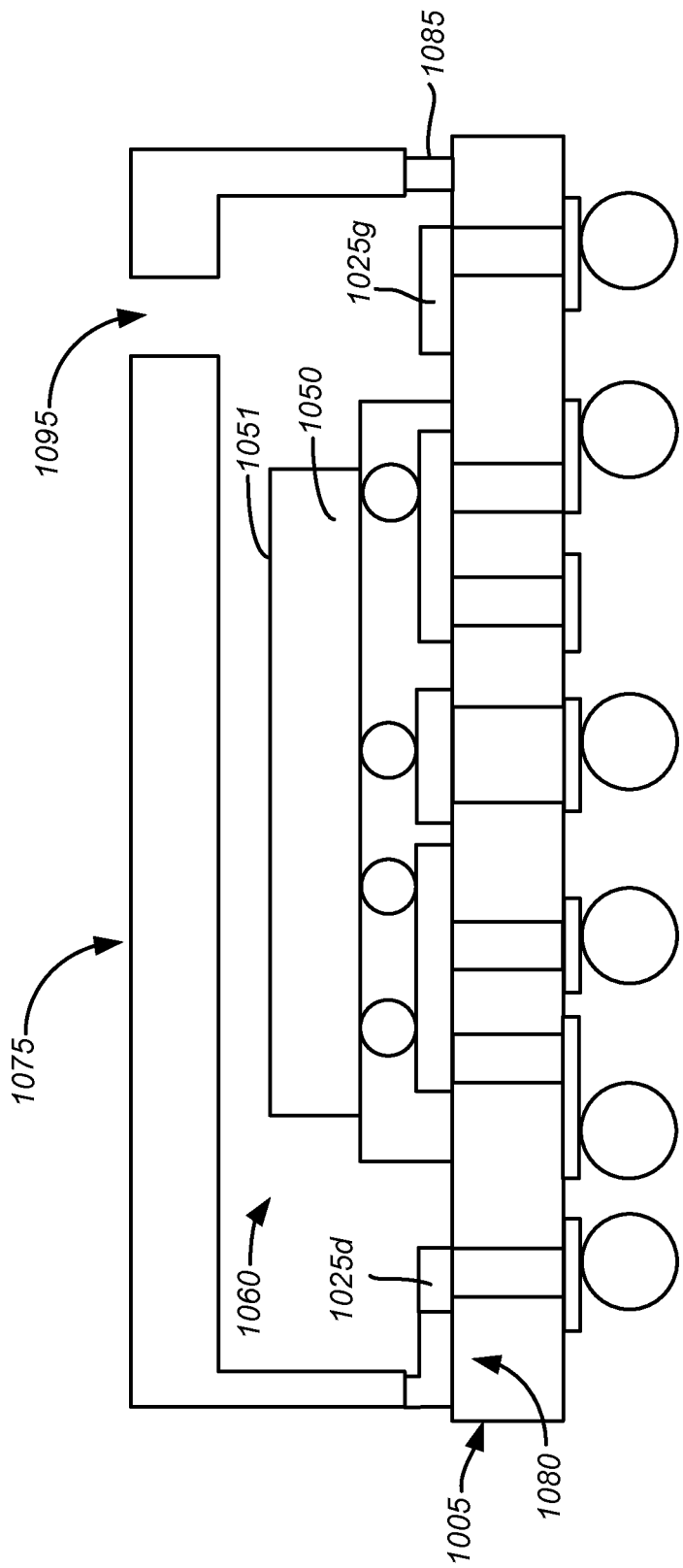

Alternatively, block 930 may involve forming a metal cage around the power amplification system 1060, as shown in FIG. 10F. In this example, a metal electromagnetic cage 1075 encloses and shields the power amplification system 1060. In this example, the electromagnetic cage 1075 is electrically grounded by the ground connection 1080. A seal ring 1085 attaches the electromagnetic cage 1075 to the glass die 1005. One or more openings 1095 may be formed in the electromagnetic cage 1075 to allow ingress and egress of air for additional heat dissipation and/or to reduce electrical parasitics. In some implementations, the electromagnetic cage 1075 may make physical and/or electrical contact with the top surface 1051 of the power amplifier chip 1050.

Figure 10G:
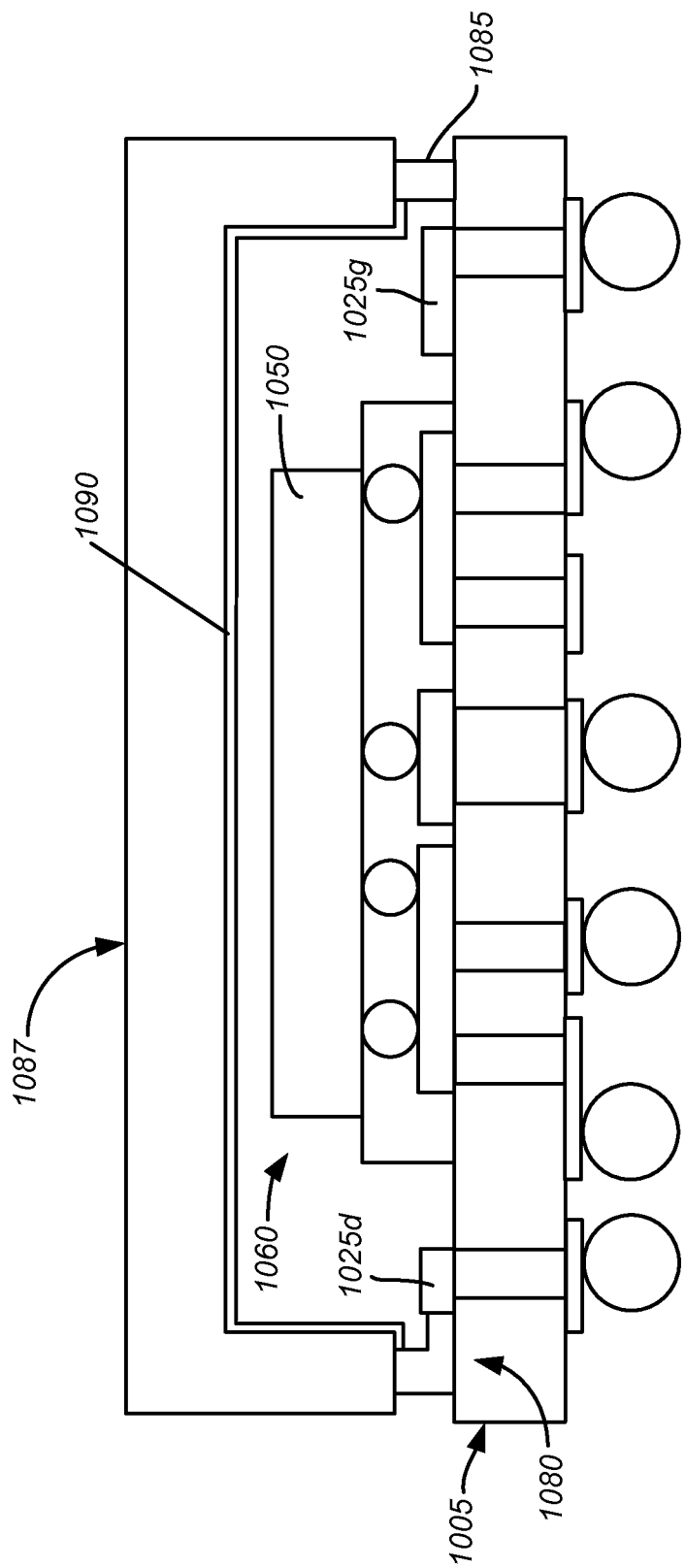

In the example shown in FIG. 10G, a glass lid 1087 having a recessed cavity covers the power amplification system 1060. In some implementations, the glass lid 1087 may have an inner metal coating 1090. In this example, the inner metal coating 1090 is electrically grounded by the ground connection 1080. The seal ring 1085 attaches the glass lid 1087 to the glass die 1005. In some implementations, the seal ring 1085 includes at least one of an epoxy, glass or metal. Example widths of the seal ring 1085 may range from about 20 microns to 500 microns. Example thicknesses of seal ring 1085 may range from about 0.1 to 100 microns. The seal ring 1085 can provide a hermetic or non-hermetic seal between the cover glass and glass substrate.

In some implementations, the power amplifier chip 1050 and the glass die 1005 may be combined and then singulated after the processes of blocks 905 through 930. At this stage, the power amplifier chip 1050 and the power combiner circuit 1029 form a power amplification system 1060.

FIG. 11A shows an example of a power amplification system that includes a power amplifier chip 1050 and a power combiner circuit 1029. In this example of power amplification system 1060, the power amplifier chip 1050 includes power amplifier circuits PA1 and PA2. The power amplifier circuit PA1 is configured to provide power to the input terminal 1105 of the power combiner circuit 1029, whereas the power amplifier circuit PA2 is configured to provide power to the input terminal 1110. Power is output from the power combiner circuit 1029 via the output terminal 1115.

FIG. 11B shows examples of passive devices that may be used in a power combiner circuit. In this example, power combiner circuit 1029 includes the inductors 1120a, 1120b, 1120c and 1120d, as well as the capacitors 1125a, 1125b and 1125c. The capacitors 1125 may, for example, be radio frequency metal-insulator-metal (RF MIM) capacitors. In some implementations, the capacitors 1125a and 1125b may have approximately equal capacitance, whereas the capacitor 1125c may have approximately twice the capacitance of the capacitors 1125a and 1125b. In some implementations, the inductors 1120a and 1120b may have approximately equal inductance. In this example, the inductor 1120c has a higher inductance than that of the inductors 1120a and 1120b, whereas the inductor 1120d has a lower inductance than that of the inductors 1120a and 1120b. Current supplied to the input terminal 1105 passes through the inductor 1120a and current supplied to the input terminal 1110 passes through the inductor 1120b. The combined signal traverses the inductor 1120c before being output via the output terminal 1115.

FIG. 11C shows another example of a power amplification system. In this example, power amplification system 1060 includes an SOI CMOS die as the power amplifier chip 1050 and an alternative power combiner circuit 1029. The power amplifier chip 1050 includes power amplifier circuits PA1, PA2 and PA3. Power from PA1, PA2 and PA3 on the power amplifier chip 1050 is combined by transformers 1150, 1155 and 1160 of the power combiner circuit 1029. The transformers 1150, 1155, and 1160 may, for example, be formed by stacked or laterally coupled coils. Although three power amplifier circuits and transformers are shown, in some implementations a larger or smaller number of power amplifier circuits and transformers may be used. The power amplifier chip 1050 may include other active and passive circuitry besides power amplifier circuits PA1, PA2 and PA3.

PA1 is configured to provide power to primary coil terminals 1150a and 1150b of the transformer 1150, PA2 is configured to provide power to primary coil terminals 1155a and 1155b of the transformer 1155, and PA3 is configured to provide power to primary coil terminals 1160a and 1160b of the transformer 1160. The terminals 1150c and 1150d are connected to the secondary coil of the transformer 1150, the terminals 1155c and 1155d are connected to the secondary coil of the transformer 1155, and the terminals 1160c and 1160d are connected to the secondary coil of the transformer 1160. The secondary coils are connected together in series and drive the output terminals 1115a and 1115b. Output signals from PA1, PA2 and PA3 may be differential.

In one implementation, the voltage output signals of PA1, PA2 and PA3 are in-phase and are added together by the series connection of the secondary coils of the transformers 1150, 1155 and 1160. In such an implementation, the powers of PA1, PA2 and PA3 can be combined to drive a load connected to the output terminals 1115a and 1115b. An advantage of this approach is that a larger voltage swing may be achieved across the terminals 1115a and 1115b than would be achieved across an individual circuit PA1, PA2 or PA3. The output voltage swing of PA1, PA2 or PA3 may be limited in part by the breakdown voltage of diode junctions in the circuit or the bandgap of the semiconducting material.

In some implementations, the transformers 1150, 1155 and 1160 may have a turn ratio of 1, less than 1, or greater than 1. In some implementations, the turn ratio of the transformers 1150, 1155 and 1160 are the same, whereas in other implementations the turn ratios are different. In some implementations the transformers 1150, 1155 and 1160 also function to provide impedance transformation.

In this example, by the time the process of block 925 is complete, the power amplification system 1060 can be mounted on the glass die 1005 and can be configured for electrical connection through the glass die 1005 to the bonding pads 1015 and the solder balls 1020. In some implementations, block 930 may involve mounting the glass die 1005 on a printed circuit board or on another device.

Figure 12:
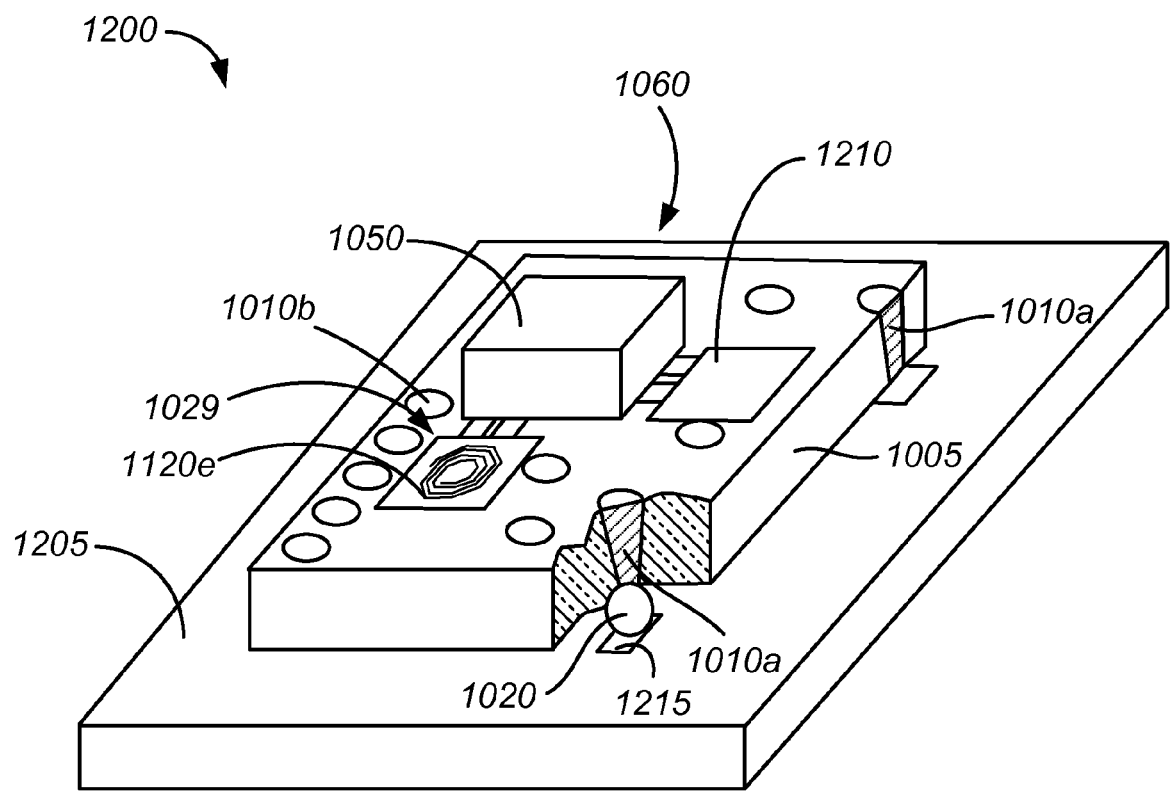
FIG. 12 shows an example of a perspective diagram of an integrated circuit stacked on a glass die, which is mounted on a printed circuit board.

One such example is depicted in FIG. 12. FIG. 12 is a perspective diagram that shows an example of an integrated circuit die 1050 stacked on a glass die 1005, which is mounted on a printed circuit board 1205. In this example, the integrated circuit die is a power amplifier chip 1050 that includes a power amplifier circuit formed on a silicon substrate. The integrated circuit die may include other circuitry. In alternative implementations, the integrated circuit die may have a different function and/or may be formed on a different substrate, such as a glass substrate. For example, the integrated circuit die may include at least part of a low noise amplifier, a mixer, an active filter, a digital signal processor, a controller, a line driver, an optical transceiver, a wireless sensor, a power supply bias generation or regulation circuit, a phased-array circuit, an analog-to-digital or digital-to-analog converter, a memory, combinations thereof and/or other devices. In this example, the power amplifier chip 1050 has been mounted on, and configured for electrical connection with, a power combiner circuit 1029 deposited on the glass die 1005 to form the power amplification system 1060.

Here, the power combiner circuit 1029 includes a number of passive devices deposited on the glass die 1005. In this implementation, an inductor 1120e is one of the components of the power combiner circuit 1029. However, other components of the power combiner circuit 1029, including passive devices, are covered by the power amplifier chip 1050 and are therefore not visible in FIG. 12. The apparatus 1200 also includes a MEMS device 1210 such as a MEMS varactor that has been formed on the glass die 1005. The MEMS device 1210 is electrically connected with the power amplification system 1060.

In this example, interconnect vias 1010a and thermal vias 1010b have been formed in the glass die 1005. Additional interconnect vias 1010a and thermal vias 1010b are located under the power amplification system 1060 and are not visible in FIG. 12. The near corner of the glass die 1005 is depicted in a "cut-away" view, so that the electrically conductive fill of one of the interconnect vias 1010a and one of the solder balls 1020 may be seen. Here, the solder ball 1020 is in contact with a conductive pad 1215 of the circuit board 1205. In this manner, the power amplification system 1060 and the other devices on the glass die 1005 may be configured for electrical connection with the circuit board 1205. In some implementations, the conductive pad 1215 is also used for heat conduction into the circuit board 1205. In some implementations, the conductive pad 1215 also can be used for electrical conduction of signals and heat conduction into the circuit board 1205. Other electrical interconnect vias 1010a and thermal vias 1010b (not shown) may be located directly beneath power amplifier chip 1050.

Figure 13:
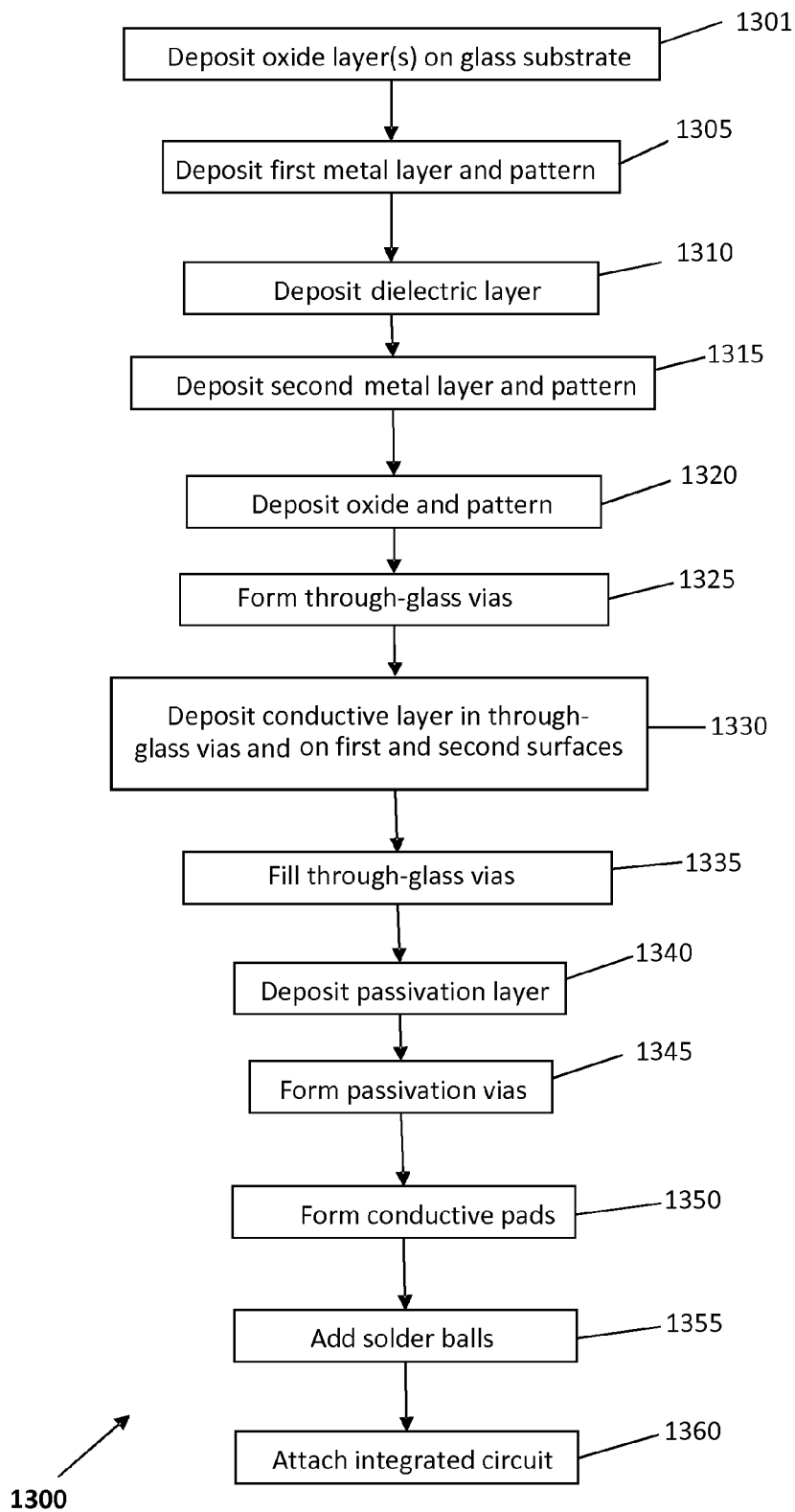
FIG. 13 shows an example of a flow diagram illustrating a process of forming passive devices on a glass substrate.
Figure 14A:

Some examples of forming passive devices will now be described with reference to FIGS. 13 and 14A through 14L. FIG. 13 shows an example of a flow diagram illustrating a process of forming passive devices on a glass substrate. FIGS. 14A-14L show examples of partial device cross-sections during stages in a process of passive device fabrication according to FIG. 13.

In block 1301 of FIG. 13, one or more oxide layers are deposited on a glass substrate. Examples are provided in FIGS. 14A and 14B, wherein an oxide layer 1401 is deposited on the glass substrate 1007 and a second oxide layer 1403 is deposited on the oxide layer 1401. In this example, the oxide layer 1401 is formed of 350 Angstroms of silicon dioxide and the second oxide layer 1403 is made of 1 um of silicon dioxide. However, in some other implementations, the oxide layer 1401 may be formed from other suitable dielectrics, such as aluminum oxide, zirconium oxide, aluminum oxide, zirconium oxide, silicon oxynitride, benzocyclobutene (BCB), polyimide, and/or silicon nitride. In some implementations, at least some such layers may be deposited using an atomic layer deposition process. In some other implementations, the oxide layers 1401 and 1403 may be formed into layers that are in the range of 50 Angstroms to 1 um.

Figure 14B:
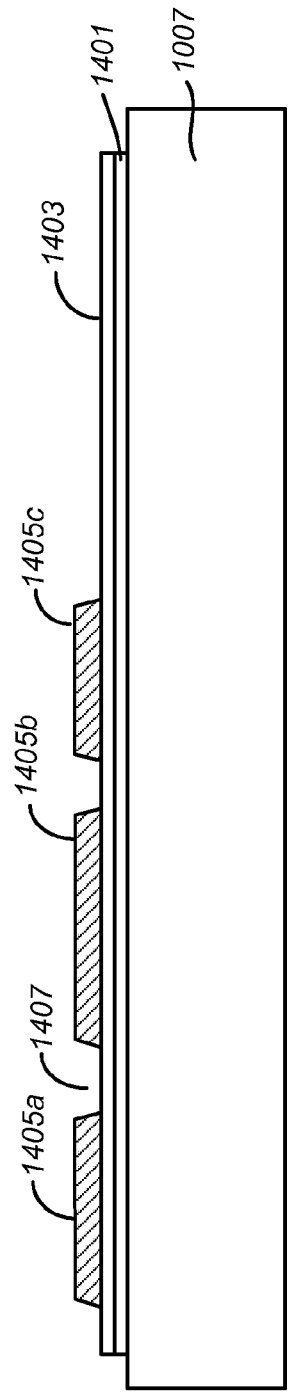

In block 1305 of FIG. 13, a first metal layer is deposited and patterned. One example is shown in FIG. 14B, wherein a metal layer 1405 has been deposited and then patterned into metal portions 1405a, 1405b and 1405c, which are separated by gaps 1407. In this example, the metal layer 1405 is approximately 1 micron thick and includes an AlSi layer formed on the oxide layer 1403 and an Mo layer formed on the AlSi layer. In some other implementations, the metal layer 1405 may be in the range of 0.1 to 3 microns in thickness and may be formed of other suitable electrically conductive material, such as Al, AlCu, Mo, nickel (Ni), titanium (Ti), ruthenium (Ru), copper, gold, silver and/or tungsten.

Figure 14C:
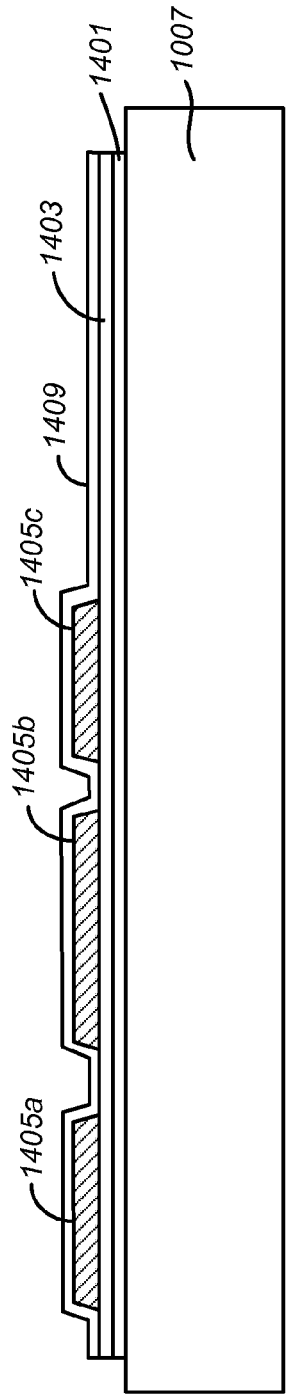
Figure 14D:
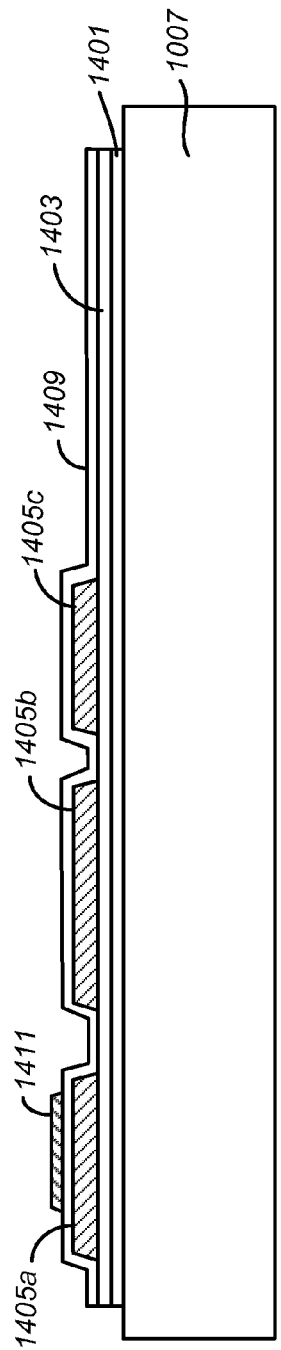

In block 1310, a dielectric layer is deposited. One example is shown in FIG. 14C, which depicts a dielectric layer 1409 that has been deposited on the metal portions 1405a, 1405b and 1405c, and on previously exposed portions of the oxide layer 1403. In this example, the dielectric layer 1409 is an $SiO_2$ layer that is 350 Angstroms thick. In some other implementations, the dielectric layer 1409 may be in the range of 50 to 10,000 Angstroms in thickness and may be formed of other suitable dielectric materials, such as an oxide of hafnium, aluminum, or zirconium, aluminum nitride, or a combination of multiple such layers.

In this example, block 1315 involves depositing and patterning a second metal layer. In the example shown in FIG. 14D, a metal layer 1411 has been deposited and patterned, leaving only a portion of the metal layer 1411 that overlies the metal portion 1405a. In this example, the metal layer 1411 is approximately 0.1 microns thick and includes an AlSi layer formed on the dielectric layer 1409 and an Mo layer formed on the AlSi layer. In some other implementations, the metal layer 1411 may be in the range of 0.1 to 2 microns in thickness and may be formed of other suitable electrically conductive material, such as AlCu, nickel, titanium, ruthenium, copper, gold, silver and/or tungsten.

Figure 14E:
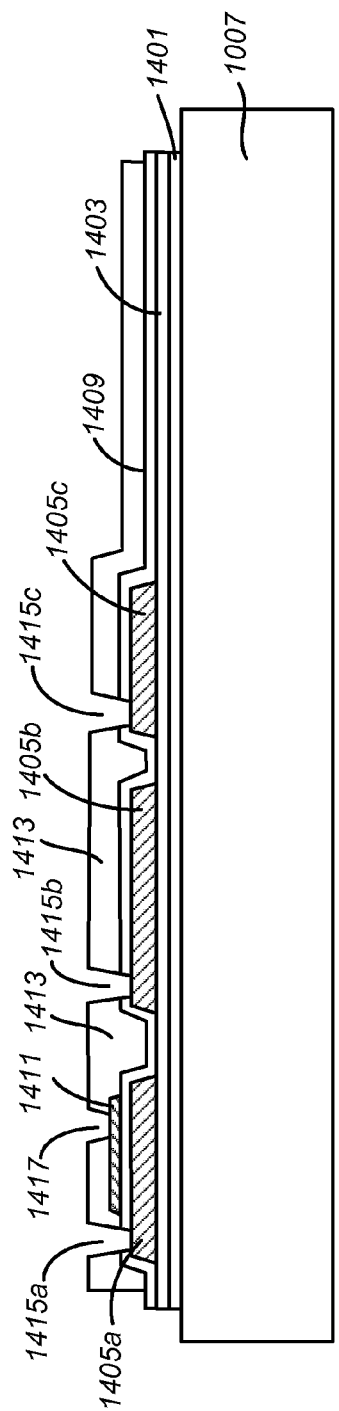

In block 1320, an oxide layer is deposited and patterned. One example is shown in FIG. 14E, which depicts an oxide layer 1413. Vias 1415a, 1415b and 1415c have been etched through the oxide layer 1413 and the dielectric layer 1409 to expose areas of the metal portions 1405a, 1405b and 1405c. Via 1417 has been etched through the oxide layer 1413 to the metal layer 1411. In this example, the oxide layer 1413 is a silicon oxynitride layer that is 1 micron thick. In some other implementations, the oxide layer 1413 may be in the range of 0.5 to 3 microns in thickness and may be formed of other suitable dielectric material, such as silicon dioxide, silicon oxynitride, silicon nitride, benzocyclobutene (BCB), polyimide, or silicon carbide.

Figure 14F:
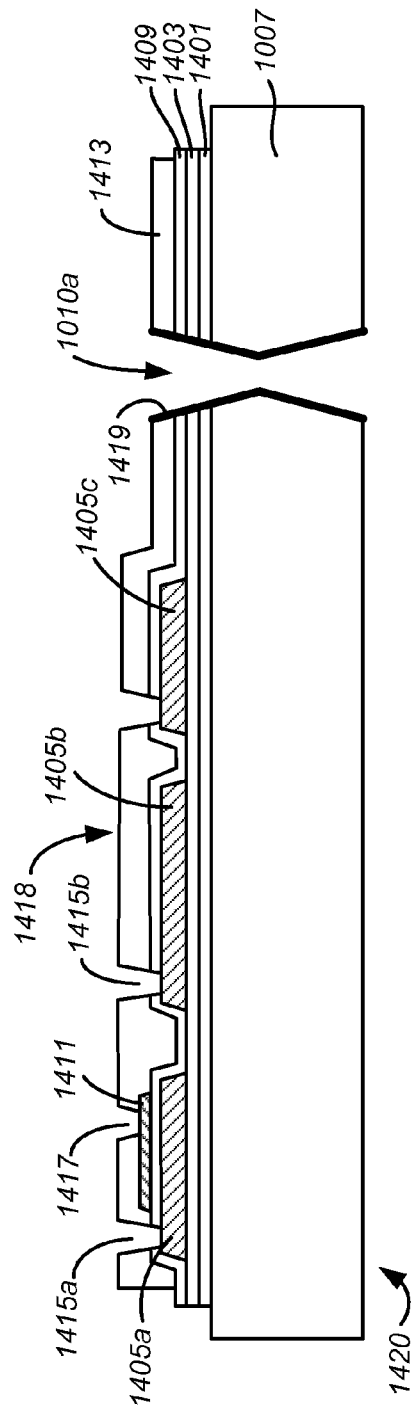

In this example, a through-glass via is formed in block 1325. Referring now to FIG. 14F, an interconnect via 1010a has been formed through the glass substrate 1007 and through the layers 1401, 1403, 1409 and 1413. A seed layer 1419 has been deposited in the interconnect via 1010a in this example. In some other implementations, the seed layer 1419 may be formed on the top surface 1418 and/or on the lower surface 1420. In this example, the seed layer 1419 is formed of 300 Angstroms of titanium followed by 2000 Angstroms of Cu. In some other implementations, the seed layer 1419 may be formed of other conductive material, such as Cr and Au, or Cr and Cu.

Figure 14G:
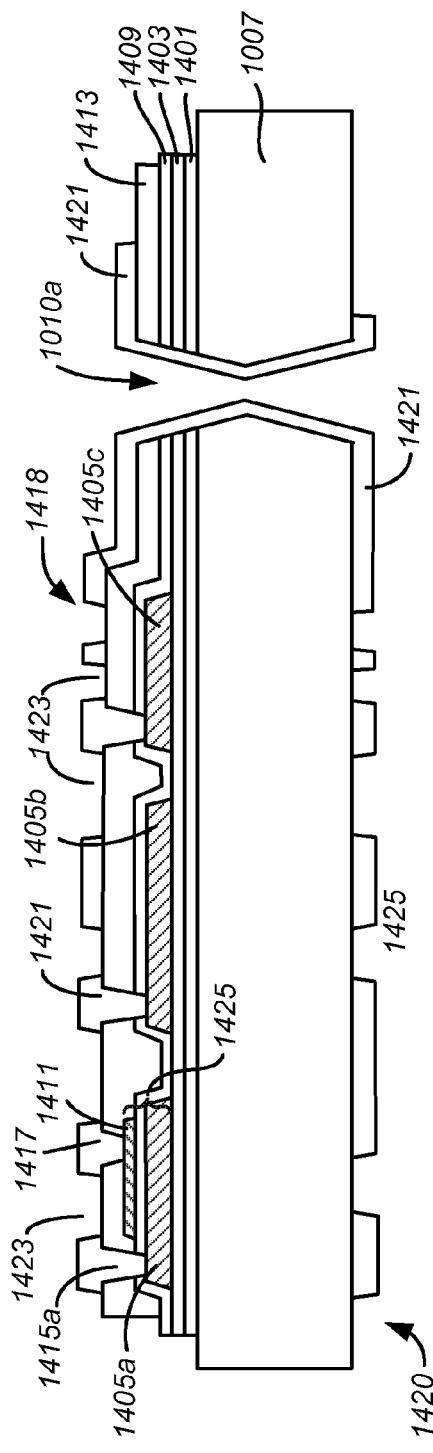
Figure 14H:
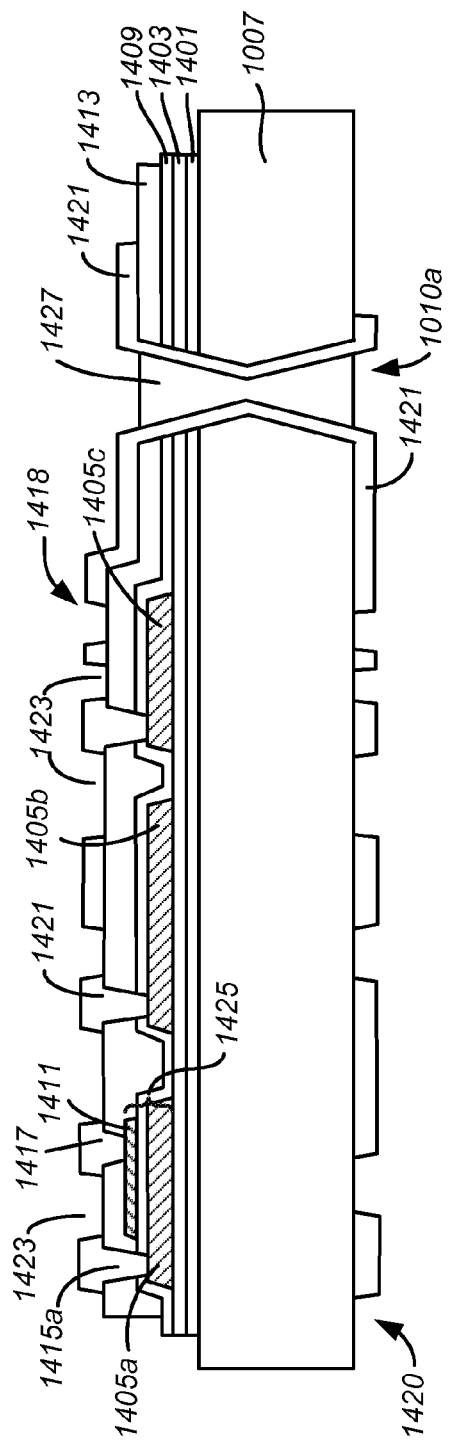

In block 1330, a conductive layer is deposited via electroplating or double-sided sputtering and then patterned. One example of the result is shown in FIG. 14G, which depicts a copper layer 1421 that has been formed on the top surface 1418, on the bottom surface 1420 and on the walls of the interconnect via 1010a. Gaps 1423 have been patterned in the copper layer 1421 in order to form and separate various electrical and or thermally conductive pathways. For example, a gap 1423 has been formed between a first portion of the copper layer 1421 that has been formed in the via 1415a and a second portion of the copper layer 1421 that has been formed in the via 1417. These portions of the copper layer 1421 provide electrical connectivity with the metal portion 1405a and the metal layer 1411, respectively, which form the lower and upper plates of capacitor 1425. One or more other passive devices may be formed of the metal portions 1405b and 1405c, such as single-turn or multi-turn inductors.

Block 1335 involves filling the through-glass vias. In the example shown in FIG. 14H, the interconnect via 1010a has been filled with electrically conductive material 1427. Materials used to fill the interconnect vias 1010a may include, for example, copper, solder (which may be in paste form) and/or metal-filled epoxy. For example, in some implementations, at least some of the vias may be filled with a paste that includes a combination of epoxy and solder, or with a paste that includes a combination of epoxy, solder and copper particles. However, other conductive materials such as gold, silver, aluminum, etc., may be used instead of copper, or in addition to copper. Moreover, in some implementations an electroplating process may be used for filling the interconnect vias 1010a. Block 1335 may or may not involve filling the thermal vias 1010b (see, e.g., FIG. 10A) with electrically conductive material. Instead, as noted above, block 1335 may involve filling the thermal vias 1010b with thermally conductive material that is not electrically conductive. However, it may be simpler to use the same electrically conductive material to fill interconnect vias 1010a and thermal vias 1010b.

In this example, a passivation layer is formed in block 1340. Referring to FIG. 14I, a passivation layer 1430 has been formed on the top surface 1418 and on the bottom surface 1420. The passivation layer 1430 may, for example be formed of polyimide, BCB, or other suitable insulating material. The passivation layer 1430 may be tens of microns in thickness, e.g. in the range of 10 to 50 microns thick. At the stage depicted in FIG. 14J, vias 1435a and 1435b have been formed through the passivation layer 1430 to expose portions of the copper layer 1421 (see block 1345 of FIG. 13).

Figure 14K:
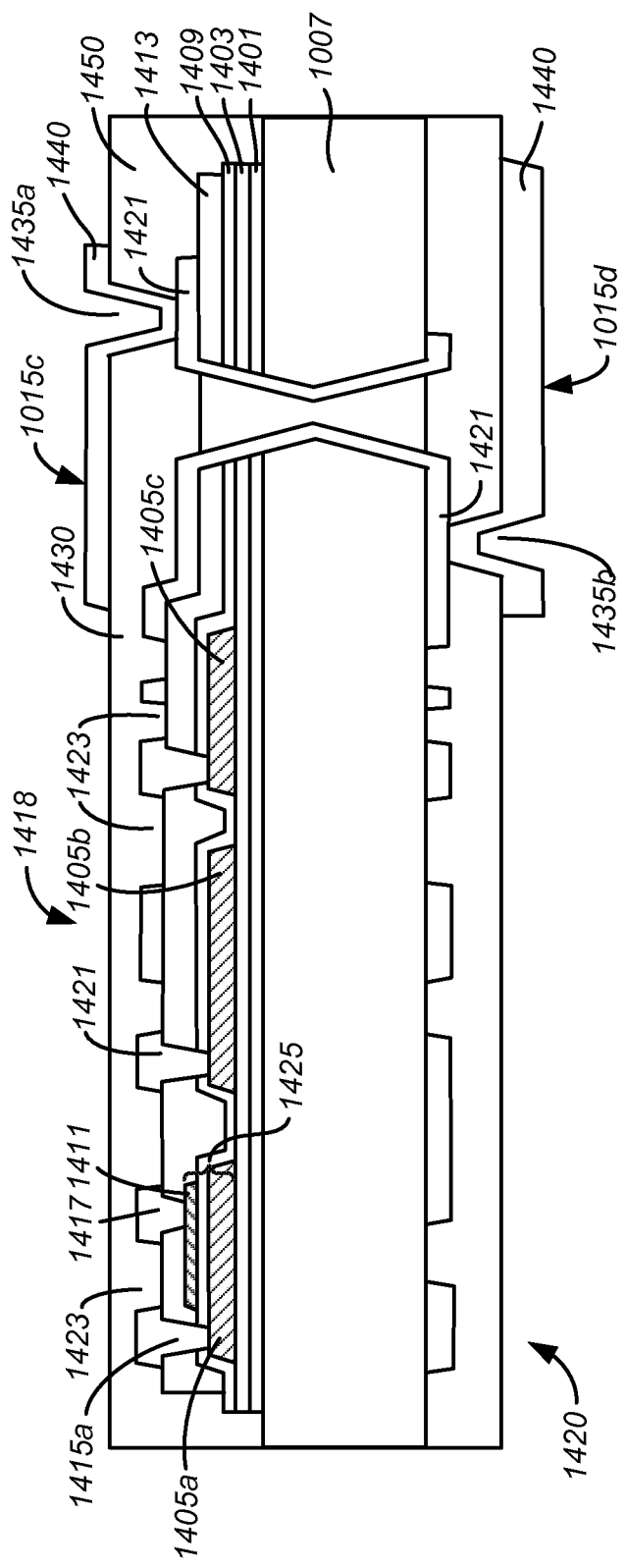
Figure 14L:
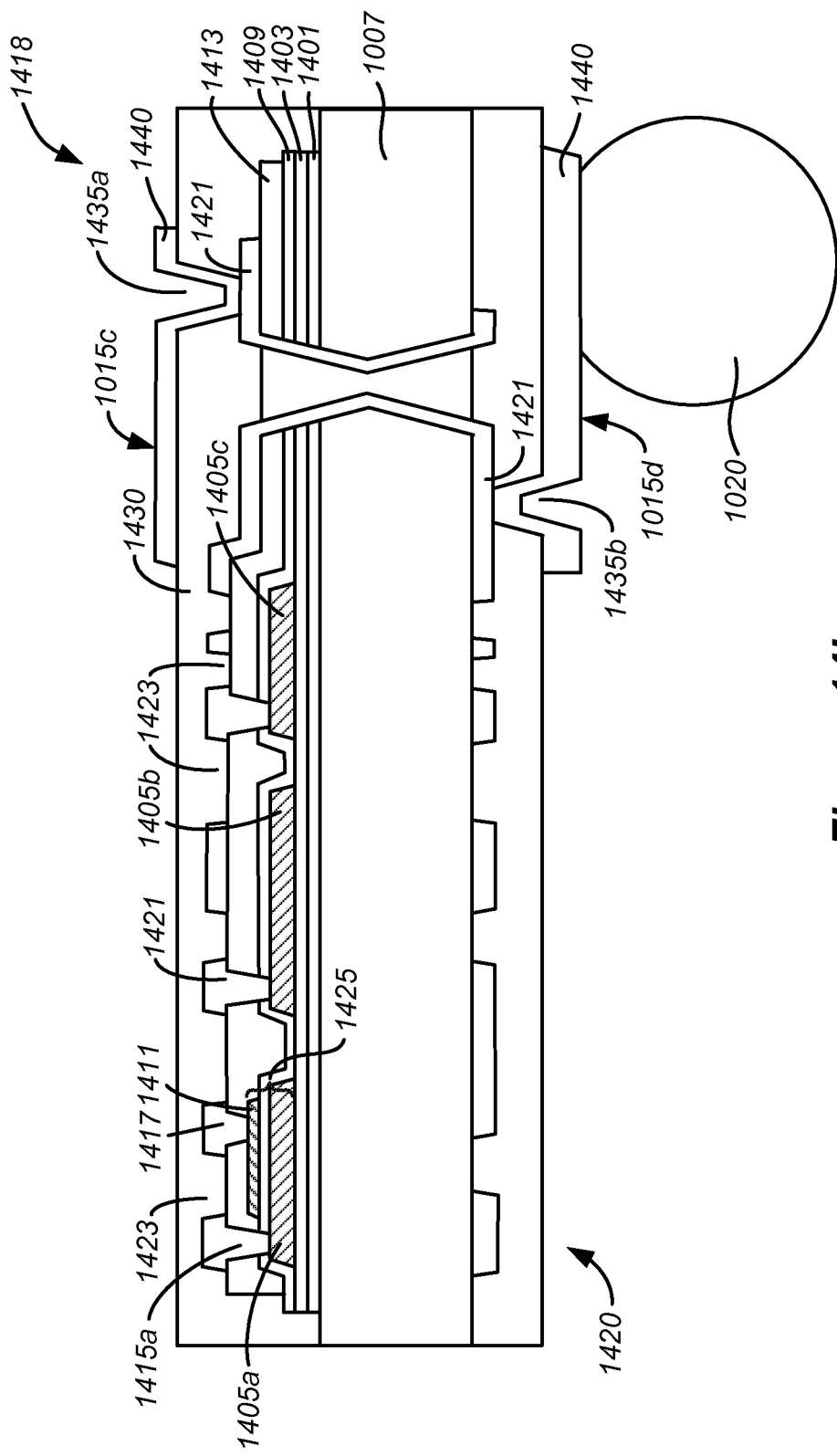

In block 1350, conductive pads are formed. As shown in FIG. 14K, a metal layer 1440 may be formed on the passivation layer 1430 and in the vias 1435a and 1435b. The metal layer 1440 may then be patterned to form the bonding pad 1015c on the top surface 1418 and the bonding pad 1015d on the bottom surface 1420. In this example, the metal layer 1440 is formed by electroplating copper, then nickel (Ni), then gold (Au). In some such implementations, the copper layer may have a thickness in the range of 5 um to 25 um, the nickel layer may have a thickness in the range of 1 um to 5 um, and the gold layer may have a thickness in the range of 0.03 um to 0.1 um, however one having ordinary skill in the art will readily recognize that thicknesses can vary depending on the particular implementation. In some other implementations, other conductive metals may be used to form the metal layer 1440.

In block 1355, one or more of the conductive pads may be configured to form an electrical connection with another device. In the example shown in FIG. 14L, the solder ball 1020 has been formed on the conductive pad 1015d. The solder ball 1020 may be used to configure the conductive pad 1015d for electrical connectivity with a corresponding part of another device, such as a printed circuit board. For example, the solder ball 1020 may be used to electrically connect the conductive pad 1015d with a conductive pad 1215 of the circuit board 1205 shown in FIG. 12. In some implementations, the solder ball 1020 also may be used to provide a path for heat dissipation.

In block 1360, an integrated circuit die is attached to and configured for electrical connectivity with the conductive pad 1015c and other conductive pads 1015 on the upper surface 1418. In some implementations, the integrated circuit die may be a CMOS SOI chip. The integrated circuit die may be attached to the conductive pads 1015 by a flip-chip process. An underfill layer may be added to further secure the connection between the integrated circuit die and the upper surface 1418. In some implementations, the resulting device may be similar to the device shown in FIG. 10C or FIG. 10D.

Figure 15A:
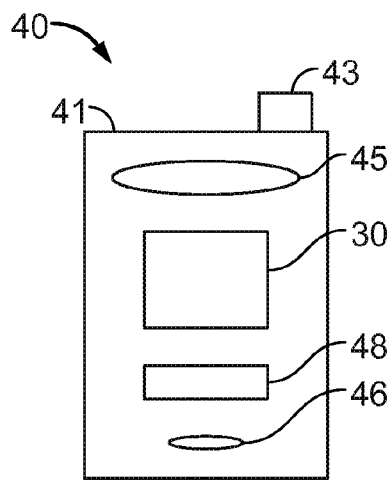
FIGS. 15A and 15B show examples of system block diagrams illustrating a display device that includes a plurality of interferometric modulators.
Figure 15B:
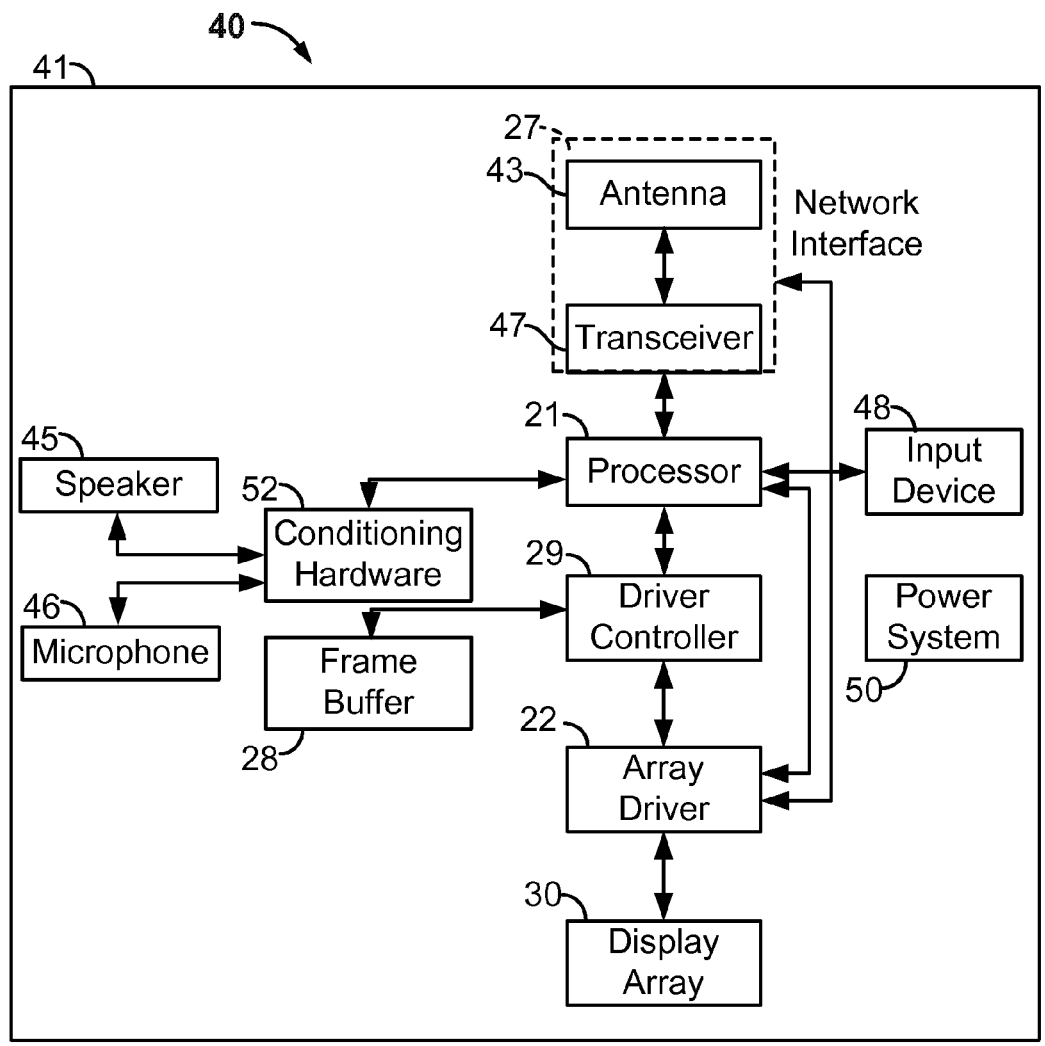

FIGS. 15A and 15B show examples of system block diagrams illustrating a display device 40 that includes a plurality of interferometric modulators. The display device 40 can be, for example, a smart phone, a cellular or mobile telephone. However, the same components of the display device 40 or slight variations thereof are also illustrative of various types of display devices such as televisions, tablets, e-readers, hand-held devices and portable media players.

The display device 40 includes a housing 41, a display 30, an antenna 43, a speaker 45, an input device 48, and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber, and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an interferometric modulator display, as described herein.

The components of the display device 40 are schematically illustrated in FIG. 15B. The display device 40 includes a housing 41 and can include additional components at least partially enclosed therein. For example, the display device 40 includes a network interface 27 that includes an antenna 43 which is coupled to a transceiver 47. The transceiver 47 is connected to a processor 21, which is connected to conditioning hardware 52. The conditioning hardware 52 may be configured to condition a signal (e.g., filter a signal). The conditioning hardware 52 is connected to a speaker 45 and a microphone 46. The processor 21 is also connected to an input device 48 and a driver controller 29. The driver controller 29 is coupled to a frame buffer 28, and to an array driver 22, which in turn is coupled to a display array 30. In some implementations, a power system 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the BLUETOOTH standard. In the case of a cellular telephone, the antenna 43 is designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G or 4G technology. The transceiver 47 can pre-process the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that is readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation, and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone integrated circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of pixels.

In some implementations, the driver controller 29, the array driver 22, and the display array 30 are appropriate for any of the types of displays described herein. For example, the driver controller 29 can be a conventional display controller or a bi-stable display controller (such as an IMOD controller). Additionally, the array driver 22 can be a conventional driver or a bi-stable display driver (such as an IMOD display driver). Moreover, the display array 30 can be a conventional display array or a bi-stable display array (such as a display including an array of IMODs). In some implementations, the driver controller 29 can be integrated with the array driver 22. Such an implementation can be useful in highly integrated systems, for example, mobile phones, portable-electronic devices, watches or other small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power system 50 can include a variety of energy storage devices. For example, the power system 50 may include a rechargeable battery, such as a nickel-cadmium battery or a lithium-ion battery. In implementations using a rechargeable battery, the rechargeable battery may be chargeable using power coming from, for example, a wall socket of a photovoltaic device or array. Alternatively, the rechargeable battery can be wirelessly chargeable. The power system 50 also can include a renewable energy source, a capacitor, or a solar cell, including a plastic solar cell or solar-cell paint. The power system 50 also can be configured to receive power from a wall outlet. The power system 50 may include a power amplification system as described herein.

In some implementations, control programmability resides in the driver controller 29 which can be located in several places in the electronic display system. In some other implementations, control programmability resides in the array driver 22. The above-described optimization may be implemented in any number of hardware and/or software components and in various configurations. The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

If implemented in software, the functions may be stored on or transmitted over as one or more instructions or code on a computer-readable medium. The steps of a method or algorithm disclosed herein may be implemented in a processor-executable software module which may reside on a computer-readable medium. Computer-readable media includes both computer storage media and communication media including any medium that can be enabled to transfer a computer program from one place to another. A storage media may be any available media that may be accessed by a computer. By way of example, and not limitation, such computer-readable media may include RAM, ROM, EEPROM, CD-ROM or other optical disk storage, magnetic disk storage or other magnetic storage devices, or any other medium that may be used to store desired program code in the form of instructions or data structures and that may be accessed by a computer. Also, any connection can be properly termed a computer-readable medium. Disk and disc, as used herein, includes compact disc (CD), laser disc, optical disc, digital versatile disc (DVD), floppy disk, and blu-ray disc where disks usually reproduce data magnetically, while discs reproduce data optically with lasers. Combinations of the above also may be included within the scope of computer-readable media. Additionally, the operations of a method or algorithm may reside as one or any combination or set of codes and instructions on a machine readable medium and computer-readable medium, which may be incorporated into a computer program product.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. The word "exemplary" is used exclusively herein to mean "serving as an example, instance, or illustration." Any implementation described herein as "exemplary" is not necessarily to be construed as preferred or advantageous over other possibilities or implementations. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of an IMOD as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An integrated device, comprising:
a glass substrate having a first surface and a second surface that is substantially parallel to the first surface;
at least one passive component on the first surface of the glass substrate;
an integrated circuit die attached to the first surface of the glass substrate;
conductive bonding pads on the second surface of the glass substrate; and
a plurality of through-glass vias extending between the first surface and the second surface of the glass substrate, the through-glass vias including interconnect vias and thermal vias, at least one of the thermal vias including thermally conductive and electrically insulating material, wherein the integrated circuit die is electrically connected to the at least one passive component and to the conductive bonding pads through at least one interconnect via.

2. The integrated device of claim 1, wherein the integrated circuit die and the at least one passive component form a low noise amplifier, a mixer, an active filter, a digital signal processor, a controller, a line driver, an optical transceiver, a wireless sensor, a power supply bias generation or regulation circuit, a phased-array circuit, an analog-to-digital or digital-to-analog converter, a memory or combinations thereof.

3. The integrated device of claim 1, wherein the at least one passive component includes a power combiner.

4. The integrated device of claim 1, wherein the integrated circuit die includes a power amplifier circuit.

5. The integrated device of claim 1, wherein the at least one passive component and the integrated circuit die form a power amplification system.

6. The integrated device of claim 1, wherein the through-glass vias include a thermal via extending between the first surface and the second surface of the glass substrate, the thermal via in thermal contact with the integrated circuit die.

7. An apparatus, comprising:
a glass substrate including conductive vias;
a power combiner circuit on a first side of the glass substrate, the power combiner circuit including a plurality of passive devices on at least the first side of the glass substrate; and
a power amplifier chip including a power amplifier circuit on a second substrate, the power amplifier chip configured for electrical connection with the power combiner circuit;
a thermally conductive material between the power amplifier chip and the power combiner circuit, the thermally conductive material capable of dissipating heat from the power amplifier system; and
conductive bonding pads on a second side of the glass substrate,
wherein the power amplifier circuit and the power combiner circuit form a power amplification system, and wherein the conductive vias include at least one thermal via configured for conducting heat from the power amplification system and one or more interconnect vias configured for electrical connection between the power amplification system and the conductive bonding pads.

8. The apparatus of claim 7, wherein the second substrate is a glass substrate, a silicon substrate, a layered silicon-insulator-silicon substrate, a gallium arsenide substrate, or a silicon-on-sapphire substrate.

9. The apparatus of claim 7, wherein the conductive bonding pads are configured for electrical connection between the power amplification system and a printed circuit board or another device.

10. The apparatus of claim 7, wherein the power amplifier chip is configured for electrical connection with the power combiner circuit via solder bumps.

11. The apparatus of claim 7, wherein the power amplifier chip covers at least a portion of the passive devices.

12. The apparatus of claim 7, further including at least one passive device or active device on a second side of the glass substrate and configured for electrical connection with the power amplification system.

13. The apparatus of claim 7, further including:
a display;
a processor that is configured to communicate with the display, the processor being configured to process image data; and
a memory device that is configured to communicate with the processor.

14. The apparatus as recited in claim 13, further including:
a driver circuit configured to send at least one signal to the display; and
a controller configured to send at least a portion of the image data to the driver circuit.

15. The apparatus as recited in claim 13, further including:
an input device configured to receive input data and to communicate the input data to the processor.

16. The apparatus as recited in claim 13, further including at least one of a receiver, a transceiver, and a transmitter.

17. The apparatus of claim 7, wherein at least one thermal via is wider than at least one interconnect via.

18. The apparatus of claim 7, further including at least one active component on the first side of the glass substrate.

19. The apparatus of claim 7, wherein the plurality of passive devices includes at least one of a resistor, a capacitor, a variable capacitor, a varactor, an inductor, a filter, a transformer, a coupler, a directional coupler, a power splitter, a transmission line, a waveguide, or an antenna.

20. The apparatus of claim 7, wherein the glass substrate is between 300 microns and 700 microns in thickness.

21. The apparatus of claim 7, wherein at least one of the thermal vias is configured for conducting electricity between the power amplification system and the second side of the glass substrate.

22. The apparatus of claim 7, wherein at least one thermal via is not configured for conducting electricity between the power amplification system and the second side of the glass substrate.

23. The apparatus of claim 7, wherein the thermal via has a width that is at least twice that of the interconnect vias.

24. The apparatus of claim 7, wherein the thermal via has a width that is between two and five times that of the interconnect vias.

25. The apparatus of claim 7, further including an enclosure around the power amplification system.

26. The apparatus of claim 25, wherein the enclosure is a molding.

27. The apparatus of claim 25, wherein the enclosure is a metal cage.

28. The apparatus of claim 25, wherein the enclosure is a glass lid having an inner metal coating.

29. The apparatus of claim 28, wherein the inner metal coating is electrically grounded.

30. A packaged electronic device that includes the apparatus of claim 7.

31. The apparatus of claim 30, wherein the packaged electronic device includes at least one additional integrated circuit.

32. A method, comprising:
forming a plurality of vias in a glass substrate;
filling the vias with conductive material;
depositing passive devices on at least a first side of the glass substrate to form a power combiner circuit;
forming conductive bonding pads on a second side of the glass substrate; and
configuring a power amplifier chip for electrical connection with the power combiner circuit to form a power amplification system, the power amplifier chip including a power amplifier circuit on a semiconducting substrate, wherein the forming involves forming at least one thermal via configured for conducting heat from the power amplification system and forming interconnect vias configured for electrical connection between the power amplification system and the conductive bonding pads on the second side of the glass substrate and wherein the configuring includes attaching the power amplifier chip to the power combiner circuit by underfilling the power amplifier chip with a thermally conductive material for dissipating heat from the power amplifier system.

33. The method of claim 32, wherein filling the vias includes filling at least the interconnect vias with electrically conductive material.

34. The method of claim 32, wherein filling the vias includes filling at least the thermal vias with thermally conductive material.

35. The method of claim 32, wherein at least one of the thermal vias is formed with a larger width than at least one of the interconnect vias.

36. The method of claim 35, wherein at least one of the thermal vias is formed with a width that is at least twice that of at least one of the interconnect vias.

37. The method of claim 35, wherein at least one of the thermal vias is formed with a width that is between two and five times that of at least one of the interconnect vias.

38. The method of claim 32, wherein forming the plurality of vias includes forming the vias by laser drilling, sand blasting or etching.

39. The method of claim 32, wherein the configuring includes attaching the power amplifier chip to the power combiner circuit via a flip-chip solder joining process, a copper pillar flip-chip joining process, or an anisotropic conductive film process.

40. The method of claim 32, wherein the power amplifier chip covers at least a portion of the passive devices.

41. The method of claim 32, further including depositing a passive device on a second side of the glass substrate.

42. An apparatus, comprising:
first glass substrate means including conductive means, wherein the conductive means includes at least one thermal via configured for conducting heat from a power amplification system on a first side of the first glass substrate means and interconnect vias configured for electrical connection between the power amplification system and a conductor on a second side of the first glass substrate means;
power combiner means on the first side of the first glass substrate means;
power amplifier means on a second substrate and configured for electrical connection with the power combiner means; and
thermally conductive means for dissipating heat from the power amplifier means, the thermally conductive means being between the power amplifier means and the power combiner means,
wherein the power amplifier means and the power combiner means include the power amplification system.

43. The apparatus of claim 42, wherein the power combiner means includes a plurality of passive devices on at least the first side of the first glass substrate means.

44. The apparatus of claim 42, wherein the power amplifier means includes an integrated circuit on a semiconducting substrate or a glass substrate.

45. The apparatus of claim 42, wherein the first glass substrate means is between 300 microns and 700 microns in thickness.

46. The apparatus of claim 42, wherein the at least one thermal via has a width that is at least twice that of the interconnect vias.

47. The apparatus of claim 42, wherein the power amplification system includes a power amplifier circuit and a transformer.

* * * * *